(12) United States Patent
Kashimura

(10) Patent No.: US 9,586,396 B2
(45) Date of Patent: *Mar. 7, 2017

(54) DRIVE CIRCUIT FOR DRIVING A CAPACITIVE LOAD

(71) Applicant: Seiko Epson Corporation, Tokyo (JP)

(72) Inventor: Toru Kashimura, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/144,972

(22) Filed: May 3, 2016

(65) Prior Publication Data

US 2016/0243823 A1 Aug. 25, 2016

Related U.S. Application Data

(63) Continuation of application No. 14/818,563, filed on Aug. 5, 2015, now Pat. No. 9,352,559.

(30) Foreign Application Priority Data

Aug. 12, 2014 (JP) .................................. 2014-164130

(51) Int. Cl.
*B41J 29/38* (2006.01)
*B41J 2/045* (2006.01)
(Continued)

(52) U.S. Cl.
CPC ....... *B41J 2/04541* (2013.01); *B41J 2/04523* (2013.01); *B41J 2/04548* (2013.01);
(Continued)

(58) Field of Classification Search
CPC .. B41J 2/14201; B41J 2/3352; B41J 2/04541; B41J 2/04581; B41J 2/04548;
(Continued)

(56) References Cited

U.S. PATENT DOCUMENTS 7,852,128 B2   12/2010  Kitazawa et al.
9,352,559 B2 *  5/2016  Kashimura .......... B41J 2/14201
2011/0292124 A1 12/2011  Anderson et al.

FOREIGN PATENT DOCUMENTS

| JP | 2006-050431 A | 2/2006 |
| JP | 2009-190287 A | 8/2009 |
| JP | 2010-114711 A | 5/2010 |

* cited by examiner

*Primary Examiner* — Julian Huffman
(74) *Attorney, Agent, or Firm* — Harness, Dickey & Pierce, P.L.C.

(57) ABSTRACT

A liquid discharge apparatus includes: a modulation circuit that generates a modulated signal by pulse-modulating a source signal; a transistor that amplifies the modulated signal to generate an amplified modulated signal; a low-pass filter that includes an inductor and a capacitor and smoothes the amplified modulated signal to generate a drive signal; a feedback circuit that returns the drive signal to the modulation circuit; a circuit board; a piezoelectric element that is displaced by application of the drive signal thereto. The circuit board has a first mounting surface and a second mounting surface. The capacitor and the feedback circuit are mounted and a first ground wiring connected to the capacitor and a second ground wiring connected to the feedback circuit are provided on the first mounting surface. At least one of the modulation circuit, the transistor, and the inductor is mounted on the second mounting surface.

5 Claims, 12 Drawing Sheets

(51) Int. Cl.
*B41J 2/30* (2006.01)
*B41J 2/335* (2006.01)
*B41J 2/355* (2006.01)
*H03K 17/687* (2006.01)
*H03K 19/0185* (2006.01)
*B41J 2/14* (2006.01)

(52) U.S. Cl.
CPC ....... *B41J 2/04581* (2013.01); *B41J 2/04588* (2013.01); *B41J 2/04593* (2013.01); *B41J 2/14201* (2013.01); *B41J 2/14233* (2013.01); *B41J 2/30* (2013.01); *B41J 2/3352* (2013.01); *B41J 2/355* (2013.01); *H03K 17/6871* (2013.01); *H03K 19/018507* (2013.01); *B41J 2/14072* (2013.01); *B41J 2002/14491* (2013.01)

(58) Field of Classification Search
CPC . B41J 2/355; B41J 2/30; B41J 2/04588; B41J 2/04593; B41J 2/14233; B41J 2/04523; B41J 2/14072; B41J 2002/14491
See application file for complete search history.

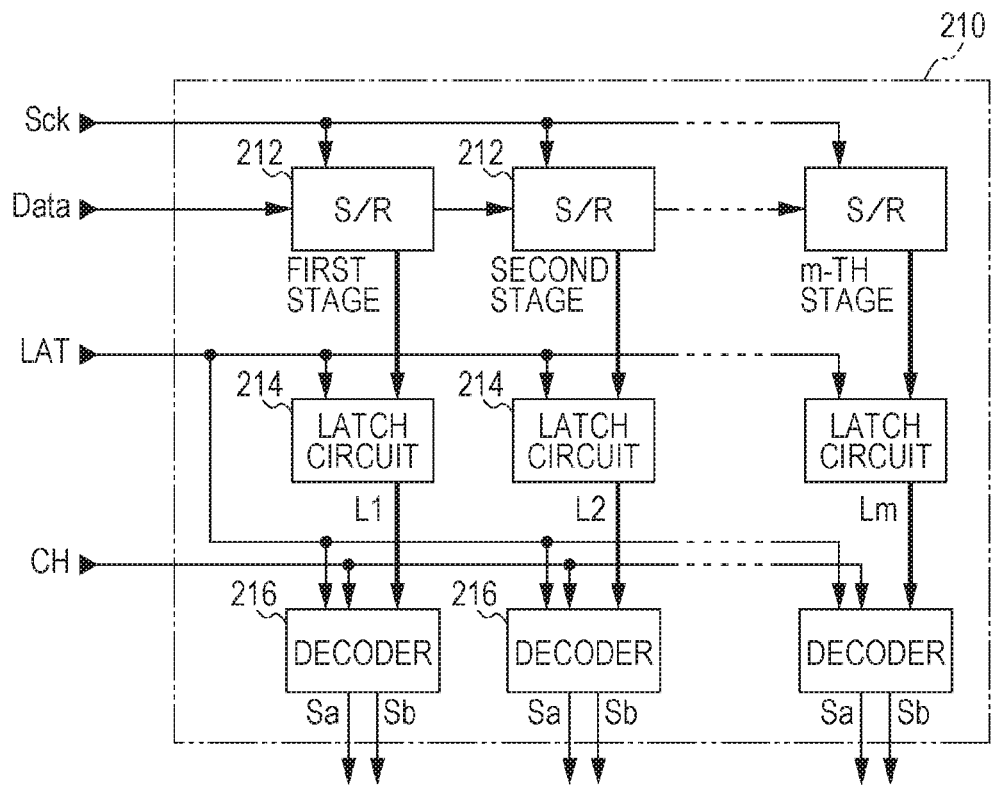

<ARRANGEMENT OF ELEMENTS (BACK SURFACE)>

<WIRING PATTERN ON BACK SURFACE>

DRIVE CIRCUIT FOR DRIVING A CAPACITIVE LOAD

This application is a continuation of U.S. patent application Ser. No. 14/818,563, filed Aug. 5, 2015, which claims priority to Japanese Patent Application No. 2014-164130, filed Aug. 12, 2014, the disclosures of which are hereby expressly incorporated by reference herein in their entireties.

BACKGROUND

1. Technical Field

The present invention relates to a liquid discharge apparatus and a head unit.

2. Related Art

As an ink jet printer that discharges an ink and prints an image or a document, a printer that uses piezoelectric elements (for example, piezo elements) is known. The piezoelectric elements are provided respectively corresponding to a plurality of nozzles in a head unit and are respectively driven in response to drive signals and thereby, a predetermined amount of an ink (liquid) is discharged from the nozzle at a predetermined timing such that a dot is formed. The piezoelectric element is a capacitive load like a capacitor in terms of electric power. Therefore, a sufficient current supply is required to operate the piezoelectric elements of the nozzles.

Therefore, a configuration is employed, in which a drive signal amplified by using an amplifier circuit is supplied to a head unit such that the piezoelectric element is driven. Examples of the amplifier circuit include an amplifier circuit having a system (linear amplification, see JP-A-2009-190287) of performing current amplification of a source signal before amplification through class AB amplification or the like. However, since the linear amplification causes great power consumption and is poor in energy efficiency, class D amplification has been proposed (see JP-A-2010-114711).

Meanwhile, recently, there has been a strong demand for an ink jet printer in which high-speed printing or multiple tones are achieved. The high-speed printing can be realized by increasing the number of dots which can be formed per unit time. However, since one amplifier circuit can drive the limited number of piezoelectric elements (nozzles), many amplifier circuits are required.

In addition, multiple tones may be realized by increasing variations of an ink amount which is discharged from the nozzle. Therefore, a configuration is employed, in which one drive signal is selected from a plurality of types of drive signals prepared in advance in accordance with an ink amount to be discharged. Many amplifier circuits are also required for this configuration.

It is necessary to reduce a space to accommodate many amplifier circuits for miniaturization of the entire ink jet printer. Here, in order to achieve a high mounting density on the amplifier circuit, it is considered that a configuration (double-sided board mounting) is employed, in which elements of the amplifier circuit are mounted on both surfaces of a circuit board.

JP-A-2006-50431 discloses a method of arrangement of the elements of a class D amplifier circuit in the double-sided board mounting.

Incidentally, as described above, the high-speed printing can be realized by increasing the number of dots which can be formed per unit time and thus, a high ink-discharge frequency is required. Therefore, it is necessary to increase a switching frequency of class D amplification and to increase a frequency of the drive signal supplied to the piezoelectric element.

However, in a case where the drive signal has a high frequency, it has been pointed out that various problems such as an occurrence of noise will arise in the configuration in which the elements of the class D amplifier circuit are mounted on both surfaces of the circuit board.

SUMMARY

An advantage of some aspects of the invention is to provide a technique which solves problems arising when elements of a class D amplifier circuit are mounted on both surfaces of a board.

According to an aspect of the invention, there is provided a liquid discharge apparatus including: a modulation circuit that generates a modulated signal by pulse-modulating a source signal; a transistor that amplifies the modulated signal to generate an amplified modulated signal; a low-pass filter that includes an inductor and a capacitor and smoothes the amplified modulated signal to generate a drive signal; a feedback circuit that allows the drive signal to return to the modulation circuit; a circuit board on which the modulation circuit, the transistor, the low-pass filter, and the feedback circuit are mounted; a piezoelectric element that is displaced by application of the drive signal thereto; a cavity that is filled with a liquid inside and has an internal volume which changes when the piezoelectric element is displaced; and a nozzle that is provided to discharge the liquid inside the cavity in response to the change of the internal volume of the cavity. The circuit board has a first mounting surface and a second mounting surface. The capacitor and the feedback circuit are mounted and a first ground wiring connected to the capacitor and a second ground wiring connected to the feedback circuit are provided on the first mounting surface. At least one of the modulation circuit, the transistor, and the inductor is mounted on the second mounting surface.

In this case, the drive signal is returned to the modulation circuit and thereby, it is possible to output the drive signal as reliable reproduction of the source signal. Here, since the elements of the circuit are mounted on both surfaces of the first mounting surface and the second mounting surface of the circuit board, it is possible to achieve high mounting density.

In addition, since the capacitor that configures the low-pass filter and the feedback circuit are mounted on the same first mounting surface of the circuit board and the first ground wiring connected to the capacitor and the second ground wiring connected to the feedback circuit are provided on the first mounting surface, a ground potential is stabilized and noise which is superimposed on a signal that is returned to the modulation circuit is decreased. Accordingly, accuracy of a waveform of the drive signal can be improved and discharge of a liquid droplet can be stabilized.

In addition, the source signal means a signal which becomes a source of the drive signal that defines a displacement of the piezoelectric element, that is, a signal before the modulation which serves as a reference of a waveform of the drive signal (including a signal defining the waveform regardless of being analog or digital). The modulated signal means a digital signal that is obtained by pulse-modulation (for example, pulse-width modulation or pulse-density modulation) of the source signal.

Incidentally, in the liquid discharge apparatus, the amplified modulated signal is smoothed such that the drive signal is generated and the piezoelectric element is displaced by the application of the drive signal such that the liquid is discharged from the nozzle. Here, when a frequency spectral analysis is performed on the waveform of the drive signal for causing the liquid discharge apparatus to discharge a small dot, for example, it turns out that a frequency component equal to or higher than 50 kHz is contained. In order to generate a drive signal including such a frequency component equal to or higher than 50 kHz, the frequency of the modulated signal (amplified modulated signal) needs to be 1 MHz or higher.

If the frequency is lower than 1 MHz, an edge of the waveform of the reproduced drive signal is blunt and round. In other words, the waveform is blunt without a sharp corner. When the waveform of the drive signal has the blunt edge, the piezoelectric element which operates in accordance with a rising or falling edge of the waveform is gradually displaced and tailing or discharge failure during discharge occurs such that quality of the printing deteriorates.

Meanwhile, when the frequency of the modulated signal is higher than 8 MHz, resolution of the waveform of the drive signal becomes higher. However, an increase of a switching frequency in the transistor results in a great switching loss, and power-saving performance and heat saving performance better than in a linear amplification such as the class AB amplification or the like are lost.

Therefore, it is preferable that a frequency of the modulated signal is from 1 MHz to 8 MHz.

In the liquid discharge apparatus, the first ground wiring and the second ground wiring may be formed as a single pattern. That is, another wiring pattern may not be present between the first ground wiring and the second ground wiring or the first ground wiring and the second ground wiring may not be divided by a through-hole. In this configuration, since a potential of the ground wiring is stabilized compared to when another wiring pattern is present, it is possible to reduce malfunction.

Incidentally, the transistor and the inductor produce heat when a current flows therethrough. In the liquid discharge apparatus, the transistor and the inductor may be mounted on the same mounting surface. In this configuration, since the heat producing transistor and inductor are mounted on the same mounting surface, heat releasing members are provided on the mounting surface.

In the liquid discharge apparatus, a plurality of sets of the drive circuits may be mounted on the circuit board. When such plurality of sets of drive circuits are mounted, it is possible to increase variations of the drive signal which are applied to the piezoelectric element and multiple tones are easily achieved by discharging of the liquid. In addition, the invention can be realized in various aspects such as a single head unit.

BRIEF DESCRIPTION OF THE DRAWINGS

The invention will be described with reference to the accompanying drawings, wherein like numbers reference like elements.

FIG. 6 is a diagram illustrating a configuration of the selection controller in the head unit.

FIG. 7 is a diagram showing decoded details of a decoder in the head unit.

DESCRIPTION OF EXEMPLARY EMBODIMENTS

Hereinafter, embodiments of the invention will be described with reference to the drawings.

A printing apparatus according to the embodiment is an ink jet printer, that is, a liquid discharge apparatus, which discharges an ink in accordance with image data supplied from an external host computer such that an ink dot group is formed on a printing medium such as paper, and thereby prints an image (including a text, a figure, or the like) in accordance with the image data.

Figure 1:
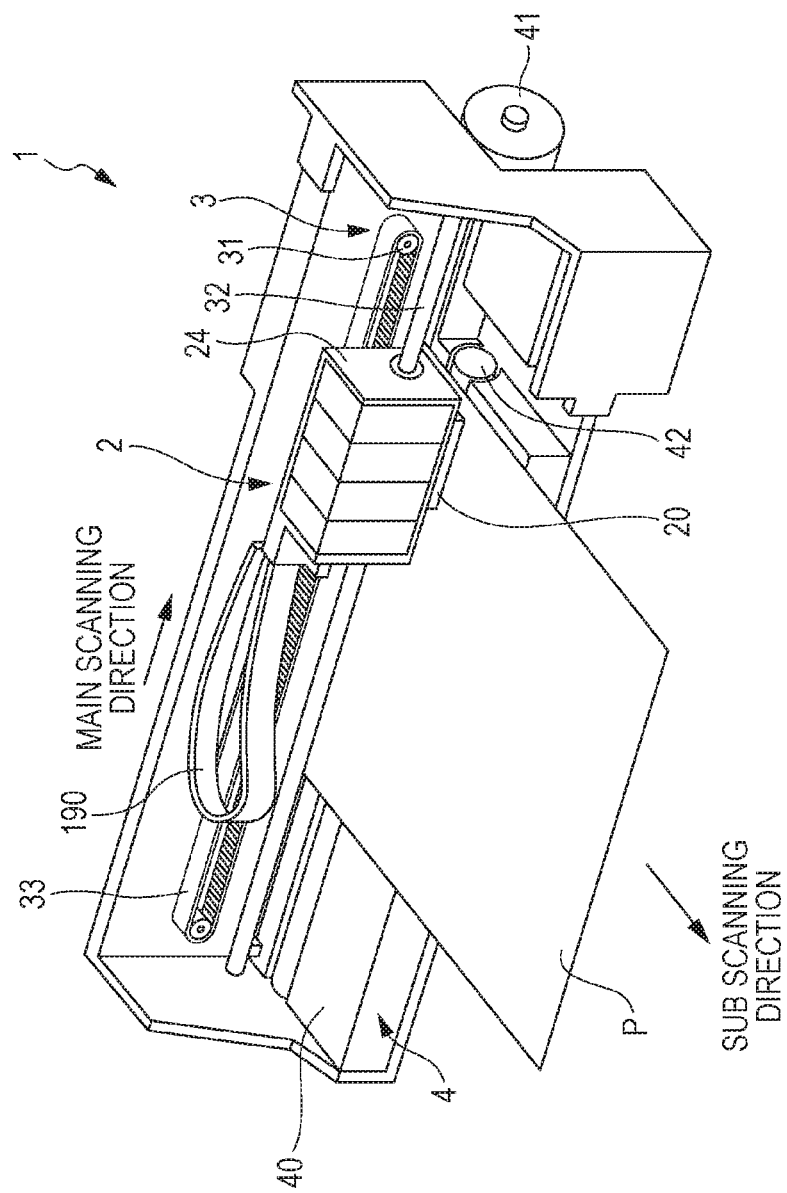
FIG. 1 is a view schematically illustrating a configuration of a printing apparatus.

FIG. 1 is a perspective view schematically illustrating an internal configuration of a printing apparatus.

As illustrated in FIG. 1, the printing apparatus 1 includes a traveling mechanism 3 that causes a traveling body 2 to travel (reciprocate) in a main scanning direction.

The traveling mechanism 3 has a carriage motor 31 that is a drive source of the traveling body 2, a carriage guide shaft 32 having both ends which are fixed, and a timing belt 33 that extends to be substantially parallel to the carriage guide shaft 32 and is driven by the carriage motor 31.

A carriage 24 of the traveling body 2 is supported by the carriage guide shaft 32 in a freely reciprocating manner and is fixed to a part of the timing belt 33. Therefore, when the carriage motor 31 causes the timing belt 33 to travel forward and reversely, the traveling body 2 is guided by the carriage guide shaft 32 so as to reciprocate.

In addition, a head unit 20 is provided at a portion of the traveling body 2, which faces a printing medium P. As will be described below, the head unit 20 discharges an ink droplet (liquid droplet) from many nozzles and has a configuration in which various control signals or the like are supplied through a flexible cable 190.

The printing apparatus 1 includes a transport mechanism 4 which causes the printing medium P to be transported onto a platen 40 in a sub scanning direction. The transport mechanism 4 includes a transport motor 41 which is a drive source and a transport roller 42 that is caused to rotate by the transport motor 41 and transports the printing medium P in the sub scanning direction.

At a timing at which the printing medium P is transported by the transport mechanism 4, the head unit 20 discharges the ink droplet onto the printing medium P and thereby, an image is formed on a surface of the printing medium P.

Figure 2:
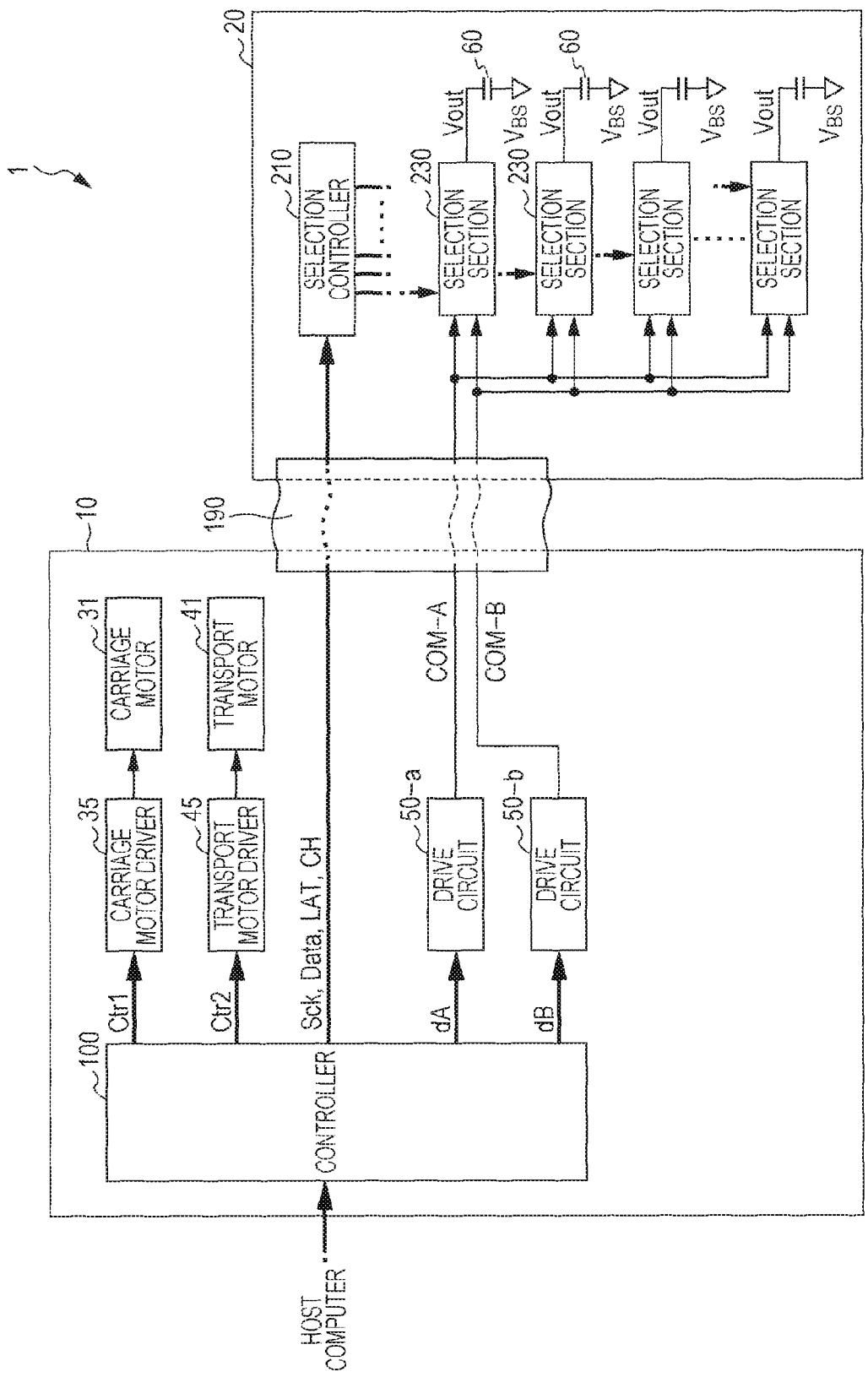
FIG. 2 is a block diagram illustrating a configuration of the printing apparatus.

FIG. 2 is a block diagram illustrating an electrical configuration of the printing apparatus.

As illustrated in FIG. 2, in the printing apparatus 1, the control unit 10 and the head unit 20 are connected through the flexible cable 190.

The control unit 10 includes a controller 100, the carriage motor 31, a carriage motor driver 35, the transport motor 41, a transport motor driver 45, and two drive circuits 50-a and 50-b. Among them, when the image data is supplied from the host computer, the controller 100 outputs various control signals or the like to control the elements.

To be more specific, first, the controller 100 supplies a control signal Ctr1 to the carriage motor driver and the carriage motor driver 35 drives the carriage motor 31 in response to the control signal Ctr1. Accordingly, travelling of the carriage 24 in the main scanning direction is controlled.

Second, the controller 100 supplies a control signal Ctr2 to the transport motor driver 45 and the transport motor driver 45 drives the transport motor 41 in response to the control signal Ctr2. Accordingly, travelling by the transport mechanism 4 in the sub scanning direction is controlled.

Third, the controller 100 supplies digital data dA to one drive circuit 50-a and supplies digital data dB to the other drive circuit 50-b, of the two drive circuits 50-a and 50-b. Here, the data dA defines a waveform of a drive signal COM-A and the data dB defines a waveform of a drive signal COM-B, among the drive signals supplied to the head unit 20.

The details will be described below and, in brief, after the drive circuit 50-a performs analog conversion of the data dA, the drive circuit 50-a supplies the drive signal COM-A which has been subjected to class D amplification to the head unit 20. Similarly, after the drive circuit 50-b performs analog conversion of the data dB, the drive circuit 50-b supplies the drive signal COM-B which has been subjected to class D amplification to the head unit 20. In addition, the drive circuits 50-a and 50-b are different only in that the data to be input and the drive signal to be output are different but have the same circuit configuration as will be described below. Therefore, in a case where there is no need to particularly distinguish the drive circuits 50-a and 50-b (for example, in a case of describing FIG. 10), hyphens and subsequent letters are omitted and, description is provided with a simple reference sign of "50".

Fourth, the controller 100 supplies a clock signal Sck, a data signal Data, and control signals LAT and CH to the head unit 20.

A plurality of sets of a selection controller 210, a selection section 230, and a piezoelectric element (piezo element) 60 are provided in the head unit 20.

The selection controller 210 instructs which to select (or no selection) from the drive signals COM-A and COM-B for each of the selection sections 230 in the control signal or the like supplied from the controller 100, the selection section 230 selects the drive signals COM-A and COM-B in response to the instruction of the selection controller 210, and the selected signal is supplied to one end of each of the piezoelectric elements 60 as the drive signal. In the drawing, a voltage of the drive signal is referred to as Vout.

In this example, a voltage $V_{BS}$ is commonly applied to the other end in each of the piezoelectric elements 60.

The piezoelectric elements 60 are provided corresponding to the plurality of nozzles in the head unit 20. Thus, the piezoelectric element 60 is displaced in accordance with a difference between the voltage Vout of the drive signal selected by the selection section 230 and the voltage $V_{BS}$ and causes the ink to be discharged. Next, a configuration for discharging the ink by driving the piezoelectric element 60 will be described concisely.

Figure 3:
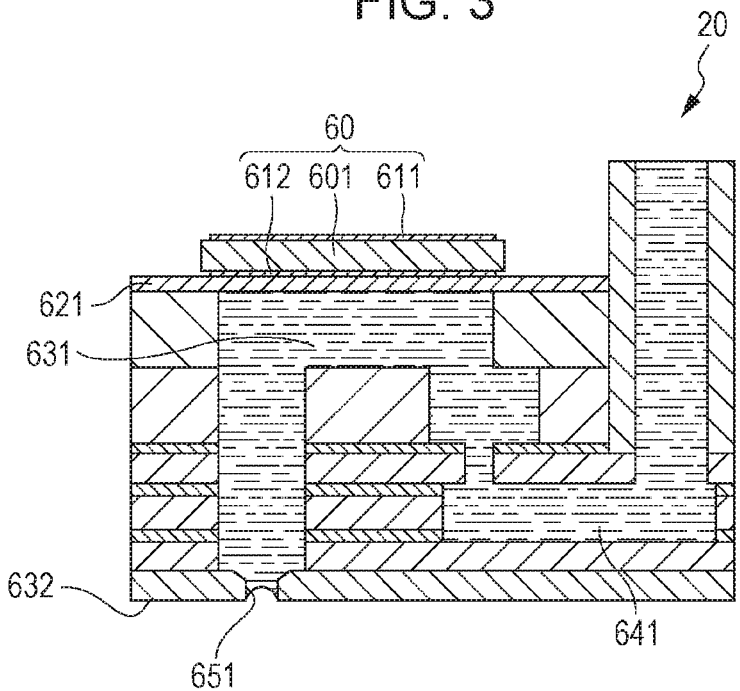
FIG. 3 is a view illustrating a configuration of a discharge section in a head unit.

FIG. 3 is a view schematically illustrating a configuration corresponding to one nozzle in the head unit 20.

As illustrated in FIG. 3, the head unit 20 includes the piezoelectric element 60, a vibration plate 621, a cavity (pressure chamber) 631, a reservoir 641, and a nozzle 651. Among them, the vibration plate 621 is deformed (flexurally vibrated) by the piezoelectric element 60 provided on the top surface in FIG. 3 and functions as a diaphragm that causes an internal volume of the cavity 631 which is filled with the ink to expand/contract. The nozzle 651 is provided in a nozzle plate 632 and is an opening which communicates with the cavity 631.

The piezoelectric element 60 illustrated in FIG. 3 has a structure in which a piezoelectric body 601 is interposed between a pair of electrodes 611 and 612. The central portion of the piezoelectric body 601 in the structure is bent in the vertical direction with respect to both end portions in FIG. 3 depending on the voltage applied by the electrodes 611 and 612 along with the electrodes 611 and 612 and the vibration plate 621. Specifically, the piezoelectric element 60 is configured to be bent upwardly when the voltage Vout of the drive signal becomes high and to be bent downwardly when the voltage Vout becomes low. In this configuration, the upward bending causes the internal volume of the cavity 631 to expand, and thus the ink is caused to be gathered from the reservoir 641 and the downward bending causes the internal volume of the cavity 631 to contract, and thus the ink is caused to be discharged from the nozzle 651 depending on a degree of the contraction.

The piezoelectric element 60 is not limited to the structure illustrated in FIG. 3 and may be a type in which the piezoelectric element 60 is caused to deform such that a liquid such as an ink can be discharged. In addition, the piezoelectric element 60 is not limited to the configuration in which the flexural vibration is used, but may have a configuration in which longitudinal vibration is used.

In addition, the piezoelectric element 60 is provided corresponding to the cavity 631 and the nozzle 651 in the head unit 20 and the piezoelectric element 60 is provided corresponding to the selection section 230 in FIG. 1. Therefore, a set of the piezoelectric element 60, the cavity 631, the nozzle 651, and the selection section 230 is provided for each nozzle 651.

Figure 4A:
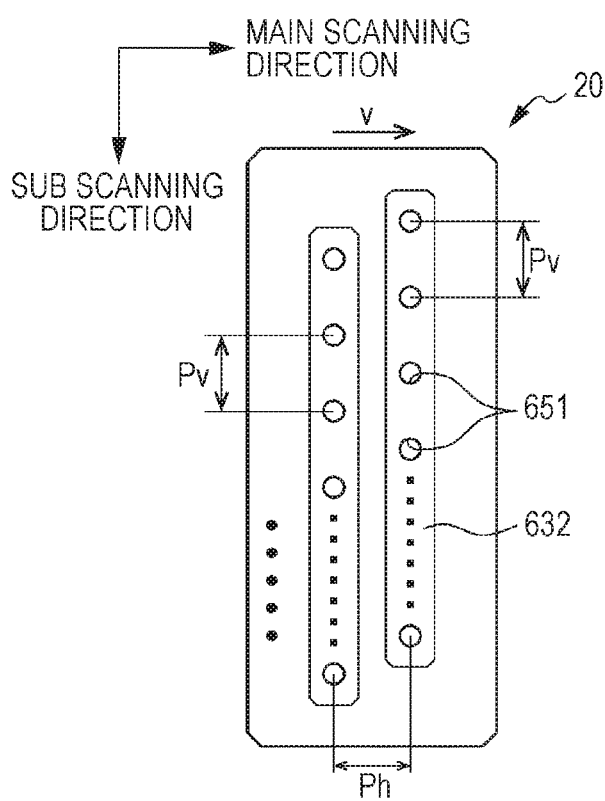
FIGS. 4A and 4B are views illustrating a nozzle array in the head unit.

FIG. 4A is a view illustrating an example of an array of the nozzles 651.

As illustrated in FIG. 4A, the nozzles 651 are arranged in two rows, for example. To be more specific, regarding one row, the plurality of nozzles 651 are disposed at a pitch Pv in the sub scanning direction, and the two rows are separated from each other at a pitch Ph in the main scanning direction and have a relationship in which one row is shifted with respect to the other row by half the pitch Pv in the sub scanning direction.

In a case of color printing, the nozzles 651 have a pattern to be provided corresponding to each color such as cyan (C), magenta (M), yellow (Y), and black (K) in the main scanning direction, but in the following description, for the sake of simplification, a case in which a tone is shown in a single color will be described.

Figure 4B:
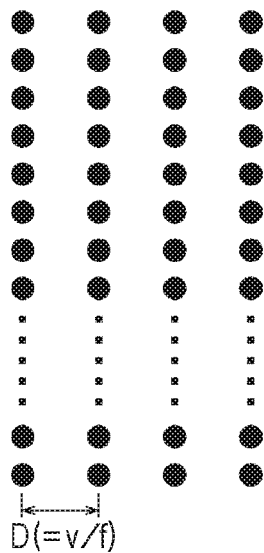

FIG. 4B is an explanatory view of basic resolution to form an image by the nozzle array illustrated in FIG. 4A. For the sake of simplification, FIG. 4B illustrates an example of a method (first method) in which an ink droplet is discharged once from the nozzle 651 and one dot is formed and black circles represent dots formed by landing of ink droplets.

As illustrated in FIG. 4B, when the head unit 20 travels in the main scanning direction at a velocity v, a distance D (in the main scanning direction) between the dots formed by landing of the ink droplets and the velocity v have a relationship as follows.

That is, in a case where an ink droplet is discharged once and one dot is formed, the dot distance D is represented by a value (=v/f) obtained by dividing the velocity v by an ink discharge frequency f, in other words, a traveling distance of the head unit 20 in a cycle (1/f) in which the ink droplets are repeatedly discharged.

In the examples in FIGS. 4A and 4B, the pitch Ph is proportional to the dot distance D by a coefficient n and the ink droplets discharged from the two rows of the nozzles 651 are caused to land on the printing medium P such that the ink droplets are aligned in the same row. Therefore, as illustrated in FIG. 4B, a gap between the dots in the sub scanning direction is half a gap between the dots in the main scanning direction. Needless to say, arrangement of the dots is not limited to the example illustrated in FIG. 4B.

Incidentally, high-speed printing may be realized simply by the high velocity v at which the head unit 20 travels in the main scanning direction. However, the high velocity v alone may result in a long distance D of the dots. Therefore, after a certain degree of resolution is secured, in order to realize the high-speed printing, it is necessary to increase the ink discharge frequency f and thus, to increase the number of dots formed per unit time.

In addition, apart from the printing speed, in order to increase the resolution, the number of dots formed per unit area may be increased. However, in a case of increasing the number of dots, adjacent dots are not only combined to each other when the ink is not discharged in a small amount, but also the printing speed is decreased when the ink discharge frequency f is not increased.

In this manner, in order to realize the high-speed printing and high-resolution printing, it is necessary to increase the ink discharge frequency f as described above.

Meanwhile, examples of the method of forming the dots on the printing medium P include a method (second method) in which the ink droplets can be discharged twice or more in a unit period, one or more ink droplets discharged in the unit period are caused to land, the one or more landing ink droplets are combined, and then, one dot is formed or a method (third method) in which the two or more ink droplets are not combined and two or more dots are formed, in addition to the method in which an ink droplet is discharged once and one dot is formed. In the following description, a case in which a dot is formed through the second method will be described.

In the present embodiment, the second method is described based on the following examples which are assumed. That is, according to the present embodiment, one dot is formed by discharging the ink twice at the maximum such that four tones of a large dot, a medium dot, a small dot, and non-recording are expressed. In order to express the four tones, two types of drive signals COM-A and COM-B are prepared in the present embodiment and each tone has a first half pattern and a second half pattern in one cycle. In the configuration, in one cycle, the drive signals COM-A and COM-B are selected (or not selected) in the first half and the second half in accordance with a tone to be expressed and are supplied to the piezoelectric element 60.

The drive signals COM-A and COM-B are described and then, a configuration of selecting the drive signals COM-A and COM-B is described. The drive signals COM-A and COM-B are generated by the drive circuits 50, respectively, and the drive circuits 50 will be described after the configuration of selecting the drive signals COM-A and COM-B for convenience.

Figure 5:
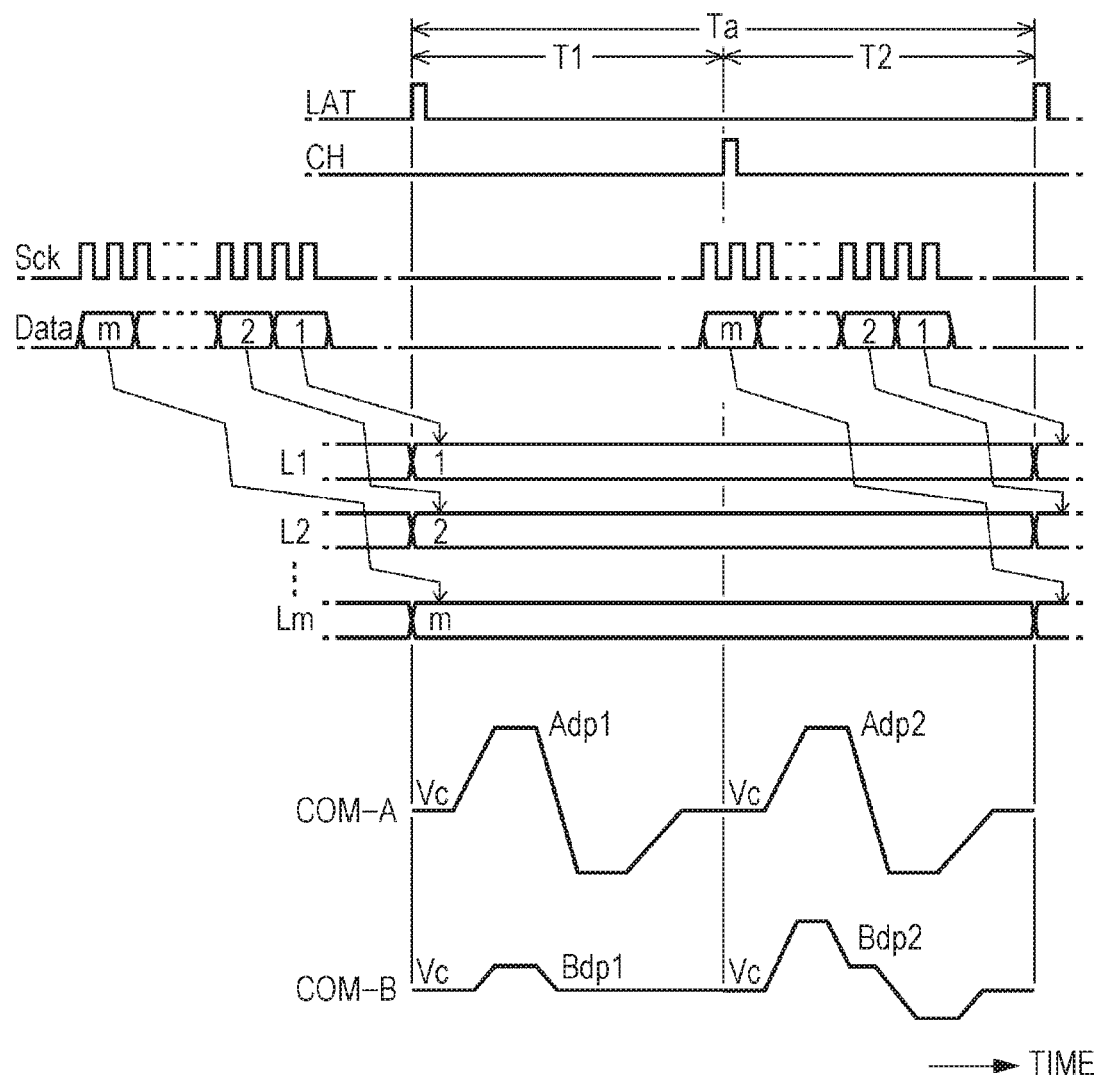
FIG. 5 is an explanatory diagram of an operation of a selection controller in the head unit.

FIG. 5 is a diagram illustrating waveforms of the drive signals COM-A and COM-B.

As illustrated in FIG. 5, the drive signal COM-A has a waveform formed by connecting a trapezoidal waveform Adp1 disposed in a period T1 from output (rising) of the control signal LAT to output of the control signal CH of a print cycle Ta with a trapezoidal waveform Adp2 disposed in a period T2 from the output of the control signal CH to the output of the next control signal LAT of the print cycle Ta.

The trapezoidal waveforms Adp1 and Adp2 according to the present embodiment are substantially the same waveforms and, when each of the waveforms is supplied to one end of a piezoelectric element 60, both waveforms cause a predetermined amount, specifically, a substantially medium amount of ink to be discharged from the nozzle 651 corresponding to the piezoelectric element 60.

The drive signal COM-B has a waveform formed by connecting a trapezoidal waveform Bdp1 disposed in the period T1 with a trapezoidal waveform Bdp2 disposed in the period T2. The trapezoidal waveforms Bdp1 and Bdp2 according to the present embodiment are different from each other. The trapezoidal waveform Bdp1 causes the ink in the vicinity of an opening of the nozzle 651 to minutely vibrate and prevents an increase in viscosity of the ink. Therefore, when the trapezoidal waveform Bdp1 is supplied to one end of the piezoelectric element 60, no ink droplet is discharged from the nozzle 651 corresponding to the piezoelectric element 60. In addition, the trapezoidal waveform Bdp2 is different from the trapezoidal waveform Adp1 (Adp2). When the trapezoidal waveform Bdp2 is supplied to one end of the piezoelectric element 60, a small amount of ink less than the predetermined amount is discharged from the nozzle 651 corresponding to the piezoelectric element 60.

Voltages at a start timing of the trapezoidal waveforms Adp1, Adp2, Bdp1, and Bdp2 and voltages at an end timing thereof are all common as a voltage Vc. In other words, the trapezoidal waveforms Adp1, Adp2, Bdp1, and Bdp2 are all started with the voltage Vc and are all ended with the voltage Vc.

FIG. 6 is a diagram illustrating a configuration of the selection controller 210 in FIG. 2.

As illustrated in FIG. 6, the clock signal Sck, the data signal Data, the control signals LAT and CH are supplied to the selection controller 210 from the control unit 10. The selection controller 210 includes a set of a shift register (S/R) 212 and a latch circuit 214, and a decoder 216 corresponding to each of the piezoelectric elements 60 (nozzles 651).

Here, when one dot of an image is formed by the data signal Data, the signal defines a size of the dot. In the present embodiment, in order to express four tones of non-recording, a small dot, a medium dot, and a large dot, the data signal Data is configured of 2 bits of the most significant bit (MSB) and the least significant bit (LSB).

The data signals Data are synchronized with the clock signal Sck and are serially supplied to each nozzle from the controller 100 along with main scanning of the head unit 20. The shift register 212 has a configuration for temporally hold the serially supplied data signals Data which are equivalent to 2 bits, corresponding to the nozzle.

To be more specific, the number of stages of the shift registers 212 corresponding to the number of piezoelectric elements 60 (nozzles) form a cascade connection with each other and the serially supplied data signals Data are transferred to a subsequent stage sequentially in accordance with the clock signal Sck.

When there are m (m is a plural number) piezoelectric elements 60, in order to distinguish the shift registers 212, the shift registers 212 are described as a first stage, a second stage, and an m-th stage sequentially from the upstream side from which the data signal Data is supplied.

The latch circuit 214 latches the data signal Data held in the shift register 212 at a rise of the control signal LAT.

The decoder 216 decodes the 2-bit data signal Data latched by the latch circuit 214 and outputs selection signals Sa and Sb for each of the periods T1 and T2 which are defined as the control signal LAT and the control signal CH such that selection in the selection section 230 is defined.

FIG. 7 is a diagram showing decoded details in the decoder 216.

In FIG. 7, latched 2-bit print data Data is described as (MSB and LSB). For example, the latched print data Data is (0,1), which means that the decoder 216 outputs logic levels of the selection signals Sa and Sb as H and L levels, respectively, in the period T1 and outputs as L and H levels, respectively, in the period T2.

The logic levels of the selection signals Sa and Sb are level-shifted by a level shifter (not illustrated) to higher amplitude logic than logic levels of the clock signal Sck, the print data Data, and the control signals LAT and CH.

Figure 8:
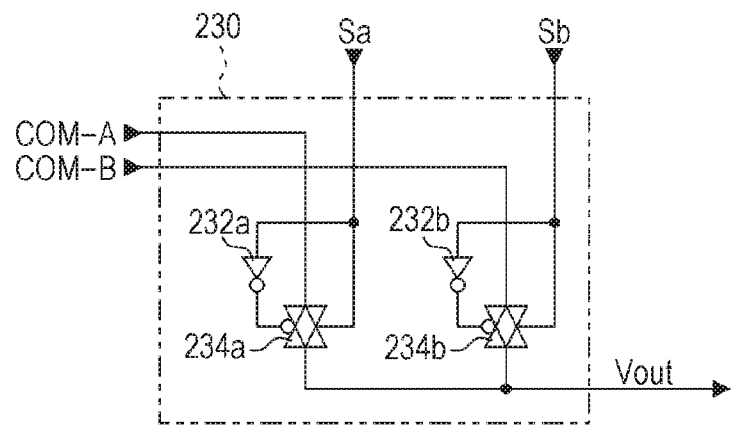
FIG. 8 is a diagram illustrating a configuration of a selection section in the head unit.

FIG. 8 is a diagram illustrating a configuration of the selection section 230 corresponding to one piezoelectric element 60 (nozzle 651) in FIG. 2.

As illustrated in FIG. 8, the selection section 230 includes inverters (NOT circuit) 232a and 232b and transfer gates 234a and 234b.

The selection signal Sa from the decoder 216 is supplied to a positive control end to which a circle is not attached in the transfer gate 234a and is subjected to logic inversion by the inverter 232a so as to be supplied to a negative control end to which a circle is not attached in the transfer gate 234a. Similarly, the selection signal Sb is supplied to a positive control end of the transfer gate 234b and is subjected to logic inversion by the inverter 232b so as to be supplied to a negative control end of the transfer gate 234b.

The drive signal COM-A is supplied to an input end of the transfer gate 234a and the drive signal COM-B is supplied to an input end of the transfer gate 234b. Output ends of the transfer gates 234a and 234b are commonly connected to each other and are connected to one end of the corresponding piezoelectric element 60.

When the selection signal Sa has the H level, the transfer gate 234a causes the input end and the output end to be conductive (on) to each other, and when the selection signal Sa has the L level, the transfer gate 234a causes the input end and the output end to be non-conductive (off) from each other. Similarly, the transfer gate 234b causes the input end and the output end to be on or off from each other in response to the selection signal Sb.

Next, operations of the selection controller 210 and the selection section 230 will be described with reference to FIG. 5.

The data signals Data are synchronized with the clock signals Sck and supplied serially to each of the nozzles from the controller 100 and transferred sequentially to the shift registers 212 corresponding to the nozzles. When the controller 100 stops the supply of the clock signal Sck, the data signal Data corresponding to the nozzle is in a state of being held in each of the shift registers 212. The data signal Data is supplied to the nozzles of the final m-th stage, . . . , the second stage, and the first stage in the shift registers 212 in a corresponding order.

Here, when the control signal LAT rises, the latch circuits 214 latch all the data signals Data held in the shift registers 212. In FIG. 5, L1, L2, . . . , Lm represent the data signals Data which are latched by the latch circuits 214 corresponding to the shift registers 212 of the first stage, the second stage, . . . , and the m-th stage.

The decoder 216 outputs the logic levels of the selection signals Sa and Sb as details illustrated in FIG. 7 in accordance with the size of the dot defined in latched data signal Data in each of the periods T1 and T2.

That is, first, in a case where the data signal Data is (1, 1) and the size of the large dot is defined, the decoder 216 outputs the selection signals Sa and Sb to be the H and L levels in the period T1, respectively, and to be H and L levels in the period T2, respectively. Second, in a case where the data signal Data is (0, 1) and the size of the medium dot is defined, the decoder 216 outputs the selection signals Sa and Sb to be the H and L levels in the period T1, respectively, and to be L and H levels in the period T2, respectively. Third, in a case where the data signal Data is (1, 0) and the size of the small dot is defined, the decoder 216 outputs the selection signals Sa and Sb to be the L and L levels in the period T1, respectively, and to be L and H levels in the period T2, respectively. Fourth, in a case where the data signal Data is (0, 0) and non-recording is defined, the decoder 216 outputs the selection signals Sa and Sb to be the L and H levels in the period T1, respectively, and to be L and L levels in the period T2, respectively.

Figure 9:
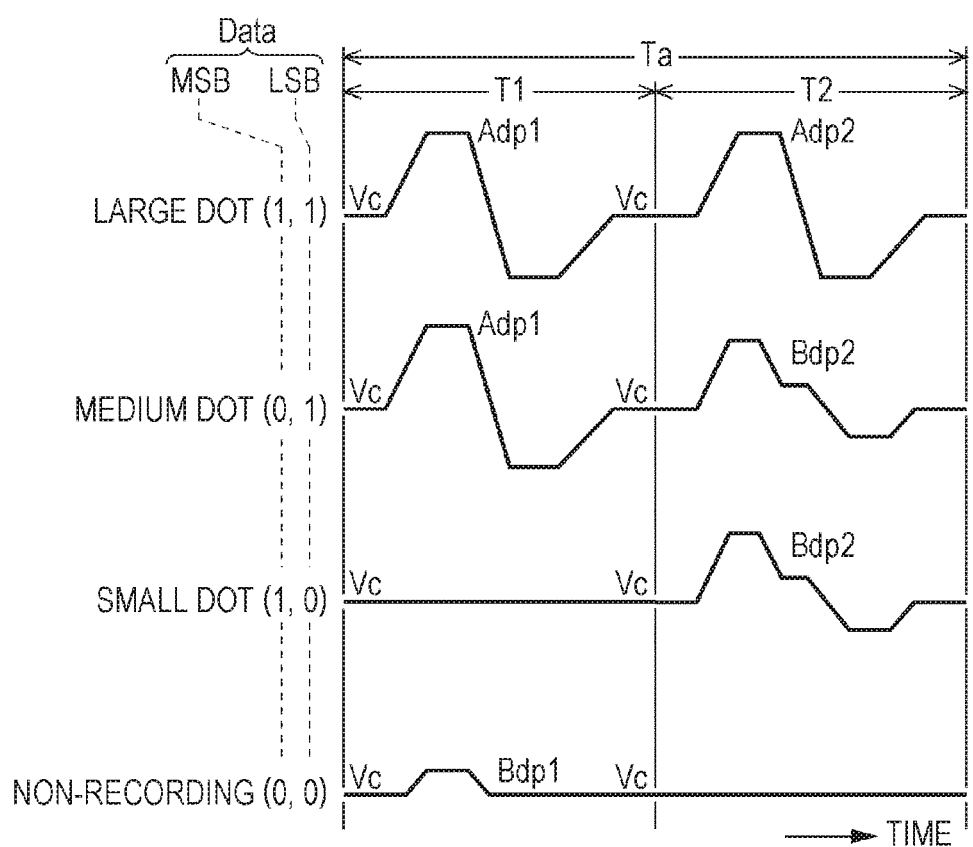
FIG. 9 is a diagram illustrating a drive signal that is selected by the selection section.

FIG. 9 is a diagram illustrating a voltage waveform of a drive signal that is selected in accordance with the data signal Data and is supplied to one end of the piezoelectric element 60.

When the data signal Data is (1, 1), the selection signals Sa and Sb have the H and L levels in the period T1, respectively. Therefore, the transfer gate 234a is turned on and the transfer gate 234b is turned off. Thus, the trapezoidal waveform Adp1 of the drive signal COM-A is selected in the period T1. Since the selection signals Sa and Sb have the H and L levels in the period T2, respectively, the selection section 230 selects the trapezoidal waveform Adp2 of the drive signal COM-A.

As above, the trapezoidal waveform Adp1 is selected in the period T1, the trapezoidal waveform Adp2 is selected in the period T2, and the waveforms are supplied to one end of the piezoelectric element 60 as the drive signal. Then, a substantially medium amount of ink is discharged twice from the nozzle 651 corresponding to the piezoelectric element 60. Therefore, the respective inks land and are combined on the printing medium P such that a large dot is formed as defined in the data signal Data.

When the data signal Data is (0, 1), the selection signals Sa and Sb have the H and L levels in the period T1, respectively. Accordingly, the transfer gate 234a is turned on and the transfer gate 234b is turned off. Therefore, the trapezoidal waveform Adp1 of the drive signal COM-A is selected in the period T1. Next, since the selection signals Sa and Sb have the L and H levels in the period T2, the trapezoidal waveform Bdp2 of the drive signal COM-B is selected.

Accordingly, a substantially medium amount of ink and a substantially small amount of ink are discharged twice from the nozzle. Therefore, the respective inks land and are combined on the printing medium P such that a medium dot as defined in the data signal Data is formed.

When the data signal Data is (1, 0), the selection signals Sa and Sb both have the L level in the period T1. Accordingly, the transfer gates 234a and 234b are turned off. Therefore, neither the trapezoidal waveforms Adp1 nor Bdp1 are selected in the period T1. In a case where the transfer gates 234a and 234b both are turned off, a path from a connection point between the output ends of the transfer gates 234a and 234b to one end of the piezoelectric element has a high impedance state in which the path is not electrically connected to any portion. However, the piezoelectric element 60 holds a voltage (Vc−$V_{BS}$) immediately before the transfer gates are turned off, by using capacity thereof.

Next, since the selection signals Sa and Sb have the L and H levels in the period T2, the trapezoidal waveform Bdp2 of the drive signal COM-B is selected. Therefore, since a substantially small amount of ink is discharged from the nozzle 651 in the period T2, a small dot as defined in the data signal Data is formed on the printing medium P.

When the data signal Data is (0, 0), the selection signals Sa and Sb have the L and H levels in the period T1, respectively. Accordingly, the transfer gate 234a is turned off and the transfer gate 234b is turned on. Therefore, the trapezoidal waveform Bdp1 of the drive signal COM-B is selected in the period T1. Next, since the selection signals Sa and Sb both have the L level in the period T2, neither the trapezoidal waveforms Adp2 nor Bdp2 is selected.

Therefore, the ink in the vicinity of an opening of the nozzle 651 minutely vibrates in the period T1 and the ink is not discharged. As a result, no dot is formed, that is, non-recording is performed as defined in the data signal Data.

As above, the selection section 230 selects (or does not select) the drive signals COM-A and COM-B in accordance with the instruction from the selection controller 210 and supplies the selected signals to one end of the piezoelectric element 60. Therefore, the piezoelectric element 60 is driven in accordance with the size of the dot defined in the data signal Data.

The drive signals COM-A and COM-B illustrated in FIG. 5 are only examples. Practically, a combination of various waveforms prepared in advance is used depending on the traveling speed of the head unit 20, properties of the printing medium P, or the like.

In addition, an example in which the piezoelectric element 60 is bent upwardly in response to an increase of the voltage is described, but when the voltage to be supplied to the electrodes 611 and 612 is inverted, the piezoelectric element 60 is bent downwardly in response to the increase of the voltage. Therefore, in a configuration in which the piezoelectric element 60 is bent downwardly in response to the increase of the voltage, the drive signals COM-A and COM-B illustrated in FIG. 5 have waveforms inverted with the voltage Vc as a reference.

In this manner, according to the present embodiment, one dot is formed on the printing medium P with the cycle Ta which is the unit period as a unit. Therefore, in the present embodiment in which one dot is formed by discharging ink droplets twice (at the maximum) in the cycle Ta, the ink discharge frequency f becomes 2/Ta and the dot distance D is represented by a value obtained by dividing the traveling velocity v of the head unit by an ink discharge frequency f (=2/Ta).

In general, the ink droplets can be discharged Q (Q is an integer of 2 or higher) times in the unit period T and it is possible for the ink discharge frequency f to be represented by Q/T in a case where the ink droplets are discharged Q times such that one dot is formed.

As in the present embodiment, in a case where different sizes of dots are formed on the printing medium P, it is necessary to shorten time taken for discharging one ink droplet once even when time (cycle) taken to form one dot is the same, compared to a case in which one ink droplet is discharged once and one dot is formed.

There is no need to provide a particular description of the third method in which two or more dots are formed without combination of two or more ink droplets.

Next, the drive circuits 50-a and 50-b will be described. The outline of one drive circuit 50-a is that the drive signal COM-A is generated as follows. That is, the drive circuit 50-a, first, performs analog conversion of the data dA supplied from the controller 100, second, returns the drive signal COM-A to be output, corrects a difference between a signal (damping signal) based on the drive signal COM-A and a target signal by a high-frequency component of the drive signal COM-A, generates a modulated signal in accordance with the corrected signal, third, generates an amplified modulated signal through switching the transistors in accordance with the modulated signal, fourth, smoothes the amplified modulated signal using a low-pass filter, and outputs the smoothed signal as the drive signal COM-A.

Figure 10:
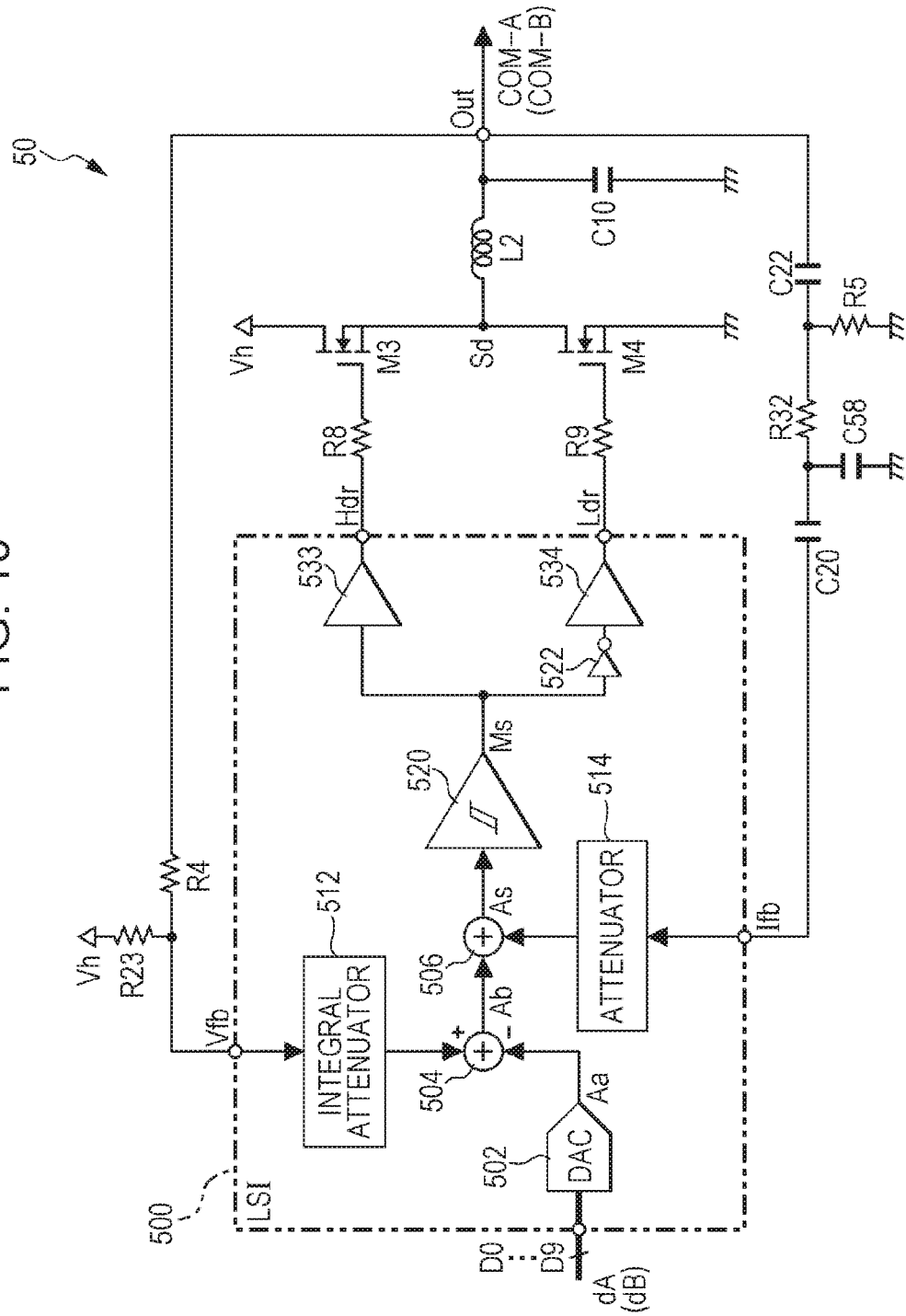
FIG. 10 is a diagram illustrating a configuration of a drive circuit in the printing apparatus.

The other drive circuit 50-b has the same configuration and is different only in that the drive signal COM-B is output from the data dB. In FIG. 10 to be described below, the drive circuits 50-a and 50-b are not distinguished and are described as the drive circuit 50.

However, the data to be input or the drive signal to be output is described as dA (dB) and COM-A (COM-B), which means that, in a case of the drive circuit 50-a, the data dA is input and the drive signal COM-A is output and, in a case of the drive circuit 50-b, the data dB is input and the drive signal COM-B is output.

FIG. 10 is a diagram illustrating a circuit configuration of the drive circuit 50.

As illustrated in FIG. 10, the drive circuit 50 is configured to include various elements such as a resistor or a capacitor, in addition to an LSI 500 or transistors M3 and M4.

The large scale integration (LSI) 500 outputs a gate signal to, for example, each of the transistors M3 and M4 based on 10-bit data dA (dB) which is input through pins D0 to D9 from the controller 100. Since the LSI 500 outputs such a gate signal, the LSI 500 includes a digital to analog converter (DAC) 502, adders 504 and 506, an integral attenuator 512, an attenuator 514, a comparator 520, a NOT circuit 522, and a gate drivers 533 and 534.

The DAC 502 converts the data dA (dB) that defines the waveform of the drive signal COM-A (COM-B) into an analog signal Aa and supplies the analog signal Aa to an input end (−) of the adder 504. A voltage amplitude of the analog signal Aa is substantially, for example, 0 volts to 2 volts. When the voltage is amplified substantially by 20 times, the drive signal COM-A is obtained. That is, the analog signal Aa is a target signal of the drive signal COM-A before amplification.

The integral attenuator 512 attenuates and integrates a voltage of a terminal Out which is input through a pin Vfb, that is, the drive signal COM-A, and supplies the attenuated and integrated signal to an input end (+) of the adder 504.

The adder 504 supplies a signal Ab of a voltage obtained by subtracting the voltage of the input end (−) from the voltage of input end (+) to one input end of the adder 506.

A power-supply voltage of a circuit from the DAC 502 to the NOT circuit 522 is 3.3 volts in a low amplitude.

Therefore, the voltage of the analog signal Aa is about 2 volts at the most. In contrast, since the voltage of the drive signal COM-A exceeds 40 volts at the most in some cases, the voltage of the drive signal COM-A (COM-B) is attenuated by the integral attenuator 512 so as to match an amplitude range of both of the voltages when calculating a difference.

The attenuator 514 attenuates the high-frequency component of the drive signal COM-A (COM-B) input through the pin Ifb and supplies the attenuated signal to the other input end of the adder 506. The adder 506 supplies the signal As of the voltage obtained by adding the voltage in one input end to the voltage in the other input end, to the comparator 520. Similar to the integral attenuator 512, the attenuation by the attenuator 514 is performed so as to match the voltage amplitude in returning of the drive signal COM-A (COM-B).

The voltage of the signal As which is output from the adder 506 is obtained by adding an attenuation voltage of a signal supplied to the pin Ifb to the difference obtained by subtracting the voltage of the analog signal Aa from an attenuation voltage of a signal supplied to the pin Vfb. Therefore, the voltage of the signal As by the adder 506 can be referred to as a signal obtained by correcting the difference obtained by subtracting the voltage of the analog signal Aa which is the target from the attenuation voltage of the drive signal COM-A (COM-B) which is output from the terminal Out, by the high-frequency component of the drive signal COM-A (COM-B).

The comparator 520 outputs a modulated signal Ms which is subjected to pulse modulation as follows, based on addition voltage by the adder 506. To be more specific, the comparator 520 outputs the modulated signal Ms which has the H level when the voltage thereof becomes a voltage threshold value Vth1 or more at the time of a voltage increase of the signal As which is output from the adder 506 and which has the L level when the voltage thereof is lower than the voltage threshold value Vth2 at the time of a voltage drop of the signal As. As will be described below, the voltage threshold value is set to have a relationship of Vth1>Vth2.

The modulated signal Ms by the comparator 520 is supplied to the gate driver 534 through logic inversion by the NOT circuit 522. The modulated signal Ms is supplied to the gate driver 533 without logic inversion. Therefore, logic levels which are supplied to the gate drivers 533 and 534 are mutually incompatible.

Therefore, the logic levels supplied to the gate drivers 533 and 534 may be subjected to timing control, actually, so as not to be H level concurrently (for the transistors M3 and M4 not to be concurrently turned on). Therefore, to be incompatible means that, to be more exact, both logic levels concurrently do not become the H level (the transistors M3 and M4 are not concurrently turned on).

Incidentally, the modulated signal means the modulated signal Ms in a more limited sense; however, when it is considered that the modulated signal is subjected to the pulse modulation in accordance with the signal Aa, the negation signal (output signal of the NOT circuit 522) of the modulated signal Ms is also included in the modulated signal. In other words, the modulated signal subjected to the pulse modulation in accordance with the signal Aa includes not only the modulated signal Ms but also a signal subjected to inverting the logic level of the modulated signal Ms or a signal subjected to the timing control.

Since the comparator 520 outputs the modulated signal Ms, a circuit to the comparator 520, that is, a circuit from the DAC 502 through the adders 504 and 506, the integral attenuator 512, and the attenuator 514, to the comparator 520 can be referred to as a modulation circuit which generates the modulated signal Ms.

In addition, in the configuration illustrated in FIG. 10, the digital data dA (dB) is converted into the analog signal Aa by the DAC 502; however, the signal Aa may be supplied from an external circuit, for example, in response to an instruction from the controller 100 without the DAC 502. Since the digital data dA (dB) and the analog signal Aa define a target value when the waveform of the drive signal COM-A (COM-B) is generated, both the digital data dA (dB) and the analog signal Aa are invariably the source signals.

The gate driver 533 performs a level shift of the modulated signal Ms having a low-logic amplitude as the output signal of the comparator 520 to a signal having a high-logic amplitude and supplies the level-shifted signal as a gate signal to the gate electrode of the transistor M3 through a resistor R8 from a pin Hdr.

The gate driver 534 performs a level shift of the modulated signal Ms having a low-logic amplitude which is subjected to logic inversion in the NOT circuit 522 to a signal having a high-logic amplitude and supplies the level-shifted signal as a gate signal to the gate electrode of the transistor M4 through a resistor R9 from the pin Ldr.

The transistors M3 and M4 are, for example, N-channel type field effect transistors (FETs). A voltage Vh (for example, 42 volts) is applied to a drain electrode in the high-side transistor M3. A source electrode in the low-side transistor M4 is grounded to a ground.

Each of the transistors M3 and M4 is turned on when the gate signal has the H level. Therefore, the amplified modulated signal generated by amplifying the modulated signal Ms exists at a connection point Sd between the source electrode of the transistor M3 and the drain electrode of the transistor M4, that is, at one end of the inductor L2. Therefore, the transistors M3 and M4 output the amplified modulated signal generated by amplifying the modulated signal Ms.

The other end of the inductor L2 is the terminal Out which becomes the output in the drive circuit 50 and the drive signal COM-A (COM-B) is supplied to the head unit 20 from the terminal Out through the flexible cable 190 (refer to FIG. 1 and FIG. 2).

In addition, the terminal Out is connected to each of one end of a capacitor C10, one end of a capacitor C22, and one end of a resistor R4. The other end of the capacitor C10 is grounded to the ground. Therefore, the inductor L2 and the capacitor C10 function as a low-pass filter (LPF) which smoothes the amplified modulated signal existing at the connection point of the transistors M3 and M4.

The other end of the resistor R4 is connected to the pin Vfb and one end of a resistor R23 and the voltage Vh is applied to the other end of the resistor R23. Accordingly, at the pin Vfb, the drive signal COM-A (COM-B) from the terminal Out is pulled up and is returned.

The other end of the capacitor C22 is connected to one end of a resistor R5 and one end of a resistor R32. The other end of the resistor R5 is grounded to the ground. Therefore, the capacitor C22 and the resistor R5 function as a high-pass filter (HPF) which allows a high-frequency component having a frequency equal to or higher than a cutoff frequency to pass through, of the drive signal COM-A (COM-B) from the terminal Out. The cutoff frequency of the HPF is set to, for example, substantially 9 MHz.

In addition, the other end of the resistor R32 is connected to one end of a capacitor C20 and one end of a capacitor C58. The other end of the capacitor C58 is grounded to the ground. Therefore, the resistor R32 and the capacitor C58 function as the low-pass filter (LPF) which allows a low-frequency component having a frequency lower than the cutoff frequency to pass through, of the signal components which passed through the HPF. The cutoff frequency of the LPF is set to, for example, substantially 160 MHz.

Since the cutoff frequency of the HPF is set to be lower than the cutoff frequency of the LPF, the HPF and the LPF function as a band pass filter (BPF) which allows a frequency component in a predetermined frequency range to pass through, of the drive signal COM-A (COM-B).

The other end of the capacitor C20 is connected to the pin Ifb of the LSI 500. Accordingly, of the high-frequency components of the drive signal COM-A (COM-B) which passed through the BPF, a DC component is cut and is returned to the pin Ifb.

Incidentally, the drive signal COM-A (COM-B) output from the terminal Out is generated by smoothing the amplified modulated signal at the connection point Sd of the transistors M3 and M4 by the low-pass filter which is configured to include the inductor L2 and the capacitor C10. Since the drive signal COM-A (COM-B) is integrated/attenuated through the pin Vfb and then is returned to the adder 504, the drive signal COM-A (COM-B) self-oscillates at a frequency determined by delay of returning (a sum of delay due to smoothing in the inductor L2 and the control unit 10 and delay by the integral attenuator 512) and by a transfer function of returning.

However, since an amount of delay in the feedback path through the pin Vfb is great, it is not possible to increase the frequency of the self-oscillation only by the returning through the pin Vfb so as to secure sufficient accuracy of the waveform of the drive signal COM-A (COM-B).

In the present embodiment, a path of returning the high-frequency component of the drive signal COM-A (COM-B) through the pin Ifb is provided in addition to the path through the pin Vfb and thereby, delay is decreased when the entire circuit is considered. Therefore, the frequency of the signal As which is obtained by adding the high-frequency component of the drive signal COM-A (COM-B) to the signal Ab is increased compared to a case where the path through the pin Ifb does not exist. Accordingly, the accuracy of the drive signal COM-A (COM-B) is sufficiently secured.

The drive circuit 50 has, as a feedback path, two paths, that is, a path through the pin Vfb and a path through the pin Ifb. Therefore, the feedback circuit of the drive circuit 50 is configured to have a circuit corresponding to two paths of the resistors R4 and R23 related to the path through the pin Vfb and the resistors R5 and R32 and capacitors C20, C22, C56 related to the path through pin Ifb.

In addition, though not illustrated in FIG. 10, a feedback circuit which is configured to include the resistors R4, R5, R23, and R32 and the capacitors C20, C22, and C56 in the drive circuit 50 is described as Fbc in some cases.

Figure 11:
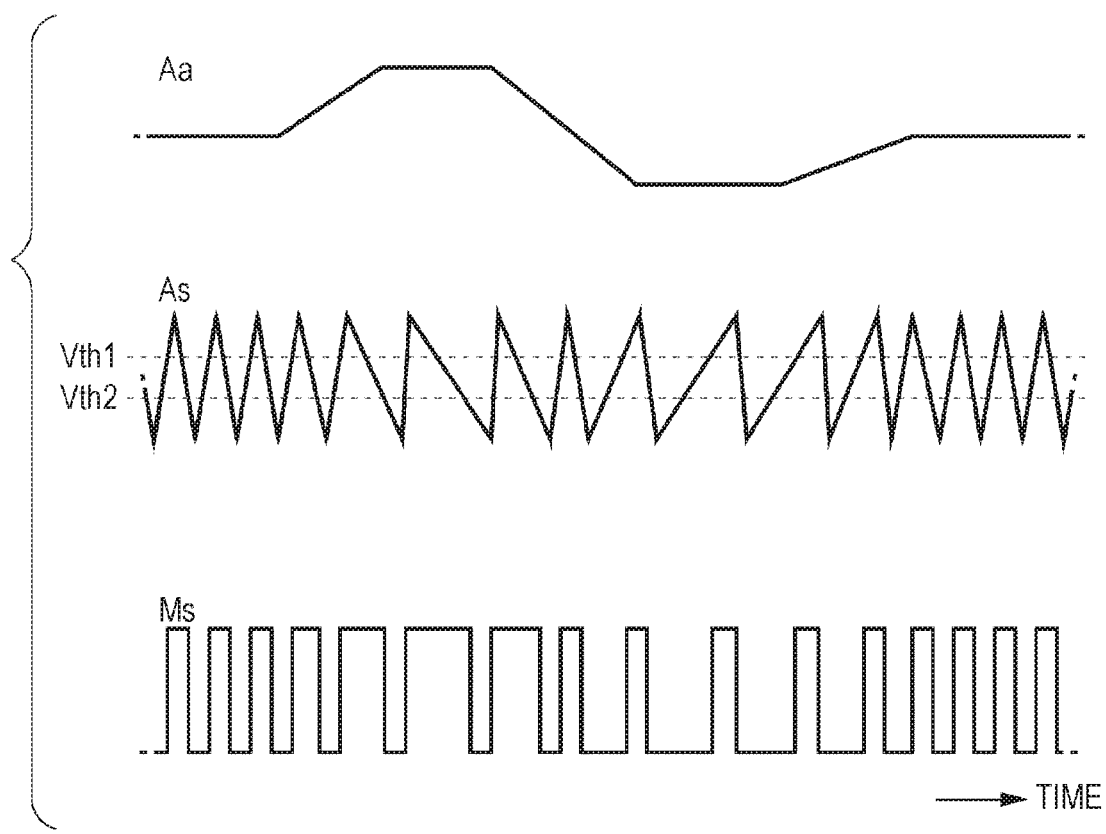
FIG. 11 is an explanatory diagram of an operation of the drive circuit.

FIG. 11 is a diagram illustrating waveforms of the signal As and the modulated signal Ms in association with the waveform of the analog signal Aa.

As illustrated in FIG. 11, the signal As is a triangular wave and an oscillation frequency thereof varies in response to a voltage (input voltage) of the analog signal Aa. Specifically, the oscillation frequency is most increased in a case where the input voltage is an intermediate value and the oscillation frequency is decreased when the input voltage is increased or decreased from the intermediate value.

In addition, a slope of the triangle in the signal As is substantially equal to rising (increase of the voltage) and drop (decrease of the voltage) when the input voltage approaches the intermediate value. Therefore, a duty ratio of the modulated signal Ms becomes substantially 50% as a result obtained by comparing the signal As with the voltages Vth1 and Vth2 by the comparator 520. When the input voltage is higher than the intermediate value, the downward slope of the signal As becomes gentle. Therefore, a period in which the modulated signal Ms has the H level becomes relatively longer and the duty ratio becomes greater. Meanwhile, when the input voltage becomes lower than the intermediate value, the upward slope of the signal As becomes gentle. Therefore, a period in which the modulated signal Ms has the L level becomes relatively shorter and the duty ratio becomes smaller.

Therefore, the modulated signal Ms becomes a pulse density modulation signal as follows. That is, the duty ratio of the modulated signal Ms is substantially 50% when the input voltage is the intermediate value, the duty ratio becomes greater when the input voltage becomes greater than the intermediate value, and the duty ratio is decreased when the input voltage becomes smaller than the intermediate value.

As described above, the gate driver 533 turns on/off the transistor M3 based on the modulated signal Ms. That is, the gate driver 533 turns on the transistor M3 when the modulated signal Ms has the H level and the gate driver 533 turns off the transistor M3 when the modulated signal Ms has the L level. The gate driver 534 turns on/off the transistor M4 based on a logic inversion signal of the modulated signal Ms. That is, the gate driver 534 turns off the transistor M4 when the modulated signal Ms has the H level and the gate driver 534 turns on the transistor M4 when the modulated signal Ms has the L level.

Accordingly, the voltage of the drive signal COM-A (COM-B) generated by smoothing the amplified modulated signal at the connection point Sd of the transistors M3 and M4 by the inductor L2 and the capacitor C10 is increased when the duty ratio of the modulated signal Ms becomes greater and the voltage is decreased when the duty ratio becomes smaller. As a result, the drive signal COM-A (COM-B) is controlled so as to become a signal which is subjected to an increase of the voltage of the analog signal Aa and is output.

Since the drive circuit 50 uses the pulse density modulation, it is advantageous that a range of change of the duty ratio can be greater compared to a pulse width modulation in which the modulation frequency is fixed.

That is, since the minimum positive pulse width and negative pulse width which can be handled in the entire circuit are restrained by the circuit properties thereof, only a predetermined range (for example, a range of 10% to 90%) can be secured as a range of change of the duty ratio in the pulse width modulation of the fixed frequency. In contrast, since the oscillation frequency is decreased in the pulse density modulation when a gap between the input voltage and the intermediate value becomes greater, the duty ratio can become greater in a region in which the input voltage is high and the duty ratio can become lower in a region where the input voltage is low. Therefore, in the self-oscillation type pulse density modulation, a broader range (for example, a range of 5% to 95%) can be secured as the range of change of the duty ratio.

In addition, in the drive circuit 50, the self-oscillation is performed and thus, a circuit that generates a carrier wave having a high frequency as in a separately-excited oscillation is not required. Therefore, it is advantageous that it is easy to integrate circuits other than circuits having a high voltage, that is, of functions taken by the LSI 500.

Since the drive circuit 50 includes, as the feedback path of the drive signal COM-A (COM-B), not only the path through the pin Vfb but also the path which returns the high-frequency component through the pin Ifb, delay is small when the entire circuit is considered. Therefore, since the frequency of the self-oscillation becomes higher, the drive circuit 50 can generate the drive signal COM-A (COM-B) with high accuracy.

The drive circuit 50 is configured to include various elements such as an LSI, a capacitor, and a resistor which are mounted on a multi-layer circuit board. Further, drive circuits 50 corresponding to a plurality of sets are mounted on one circuit board. Next, in the drive circuits 50-*a* and 50-*b*, how the elements which configure the drive circuits are disposed and are mounted on both surfaces of the circuit board will be described.

Figure 12:
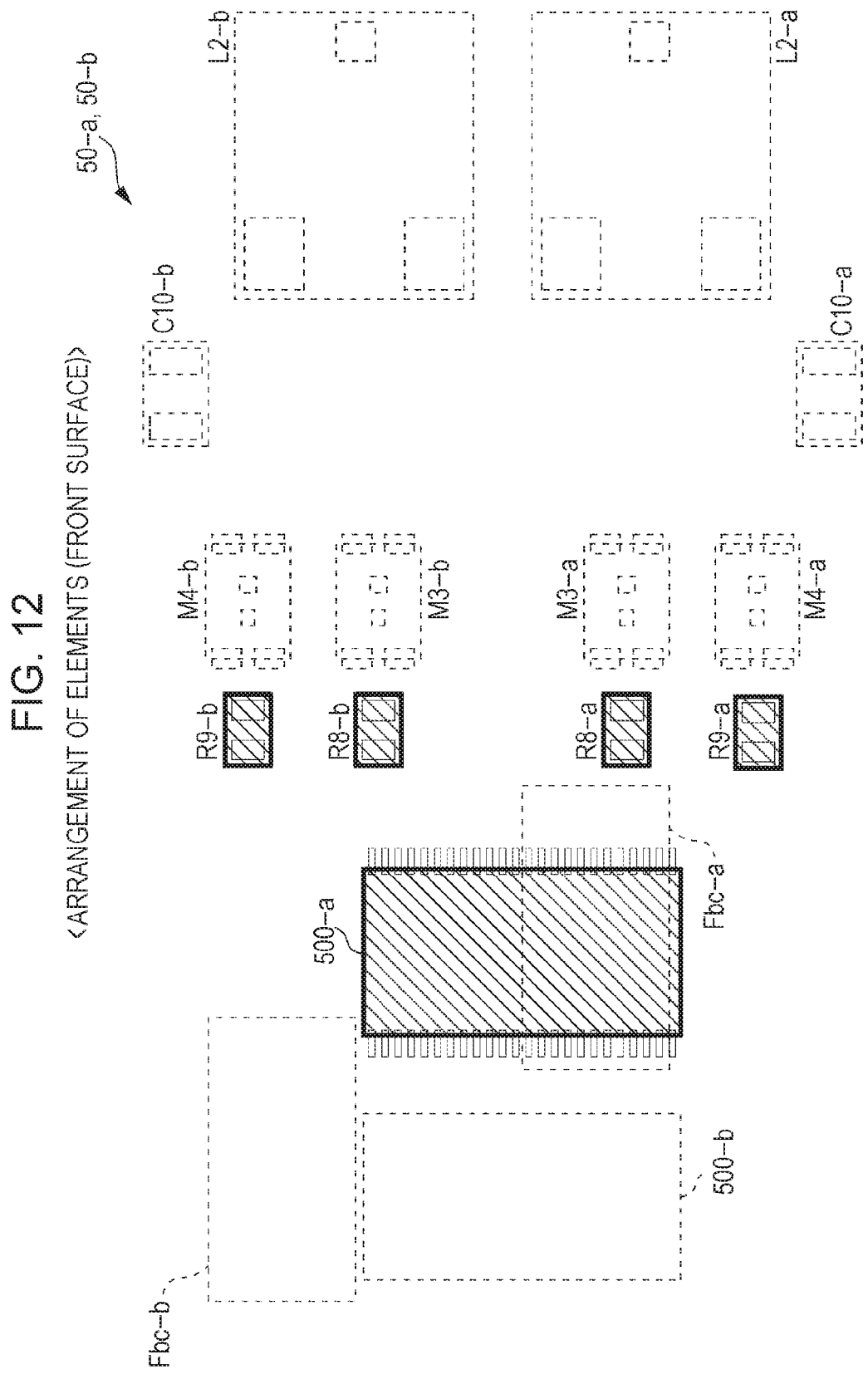
FIG. 12 is a view illustrating an arrangement of elements mounted on a front surface of a circuit board.
Figure 13:
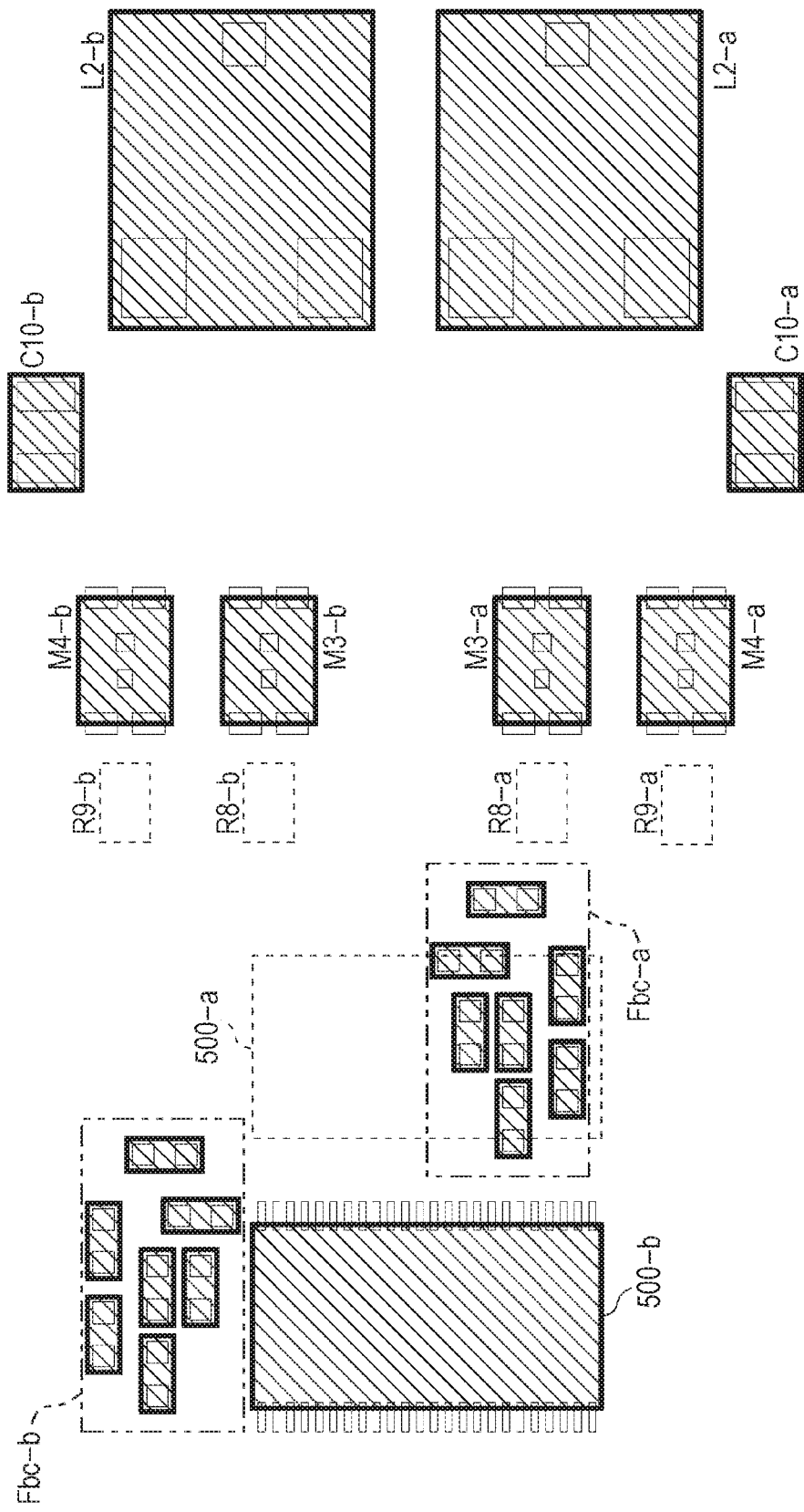
FIG. 13 is a plan view illustrating an arrangement of elements mounted on a back surface of the circuit board.

FIG. 12 is a view illustrating the arrangement of the elements mounted on the front (face) surface as a second mounting surface in the circuit board when the circuit board is viewed in a plan view. FIG. 13 is a view illustrating a state in which the arrangement of the elements mounted on the back surface as a first mounting surface in the circuit board is viewed through the front surface. The front surface and the back surface are opposite to each other and the terms are only used to distinguish one surface from the other surface of both surfaces for convenience. That is, when one surface is referred to as the front surface, the other surface is referred to as the back surface.

In addition, in FIGS. 12 and 13, in order to distinguish the elements that configure the drive circuits 50-*a* and 50-*b*, "-a" is attached to the end of a reference sign that represents an element that configures the drive circuit 50-*a* and "-b" is attached to the end of a reference sign that represents an element that configures the drive circuit 50-*b*, of the elements illustrated in FIG. 10 without distinction. For example, an inductor L2-*a* means an element that configures the drive circuit 50-*a* and a transistor M3-*b* means an element that configures the drive circuit 50-*b*.

As illustrated in FIGS. 12 and 13, transistors M3-*a* and M4-*a*, an inductor L2-*a*, a capacitor C10-*a*, a feedback circuit Fbc-a which configure the drive circuit 50-*a* and an LSI 500-*b*, transistors M3-*b* and M4-*b*, an inductor L2-*b*, capacitor C10-*b*, and a feedback circuit Fbc-b which configure the drive circuit 50-*b* are mounted on the back surface of the circuit board. That is, in the drive circuits 50-*a* and 50-*b*, the elements of the low-pass filter and the elements of the feedback circuits Fbc-a and Fbc-b are mounted on the same back surface.

Meanwhile, on the front surface of the circuit board, an LSI 500-*a* that configures the drive circuit 50-*a* is mounted on a position thereof which does not overlap an LSI 500-*a* mounted on the back surface in a plan view, resistors R8-*a* and R9-*a* which configure the drive circuit 50-*a*, resistors R8-*b* and R9-*b* which configure the drive circuit 50-*b* are mounted.

In the drive circuit 50-*a*, the gate signal which is output from the pin Hdr of the LSI 500-*a* mounted on the front surface is supplied to the gate electrode of the transistor M3-*a* mounted on the back surface through a through-hole (via) not illustrated after passing through the resistor R8-*a* mounted on the same front surface. Similarly, the gate signal which is output from the pin Ldr is supplied to the gate electrode of the transistor M4-*a* mounted on the back surface through the through-hole after passing through the resistor R9-*a* mounted on the front surface. In addition, in the drive circuit 50-*a*, a two-system feedback signal through the feedback circuit Fbc mounted on the back surface is returned to the pin Vfb and the pin Ifb of the LSI 500-*a* mounted on the front surface through the through-hole (not illustrated).

Meanwhile, in the drive circuit 50-*b*, the gate signal which is output from the pin Hdr of the LSI 500-*b* mounted on the back surface is supplied to the gate electrode of the transistor M3-*b* after passing through one end of the resistor R8-*a* mounted on the front surface through the through-hole and from the other end of the resistor R8-*b* through the through-hole and is guided to the back surface again. Similarly, the gate signal which is output from the pin Ldr is supplied to the gate electrode of the transistor M4-*b* after being supplied to one end of the resistor R9-*b* mounted on the front surface through the through-hole from the pin Ldr of the LSI 500-*b* mounted on the back surface from the other end of resistor R9-*b* to the back surface again through the through-hole. In addition, in the drive circuit 50-*b*, a two-system feedback signal through the feedback circuit Fbc-a mounted on the back surface is returned to the pin Vfb and the pin Ifb of the LSI 500-*b* without the through-hole.

Incidentally, in the drive circuit 50 illustrated in FIG. 10, the transistors M3 and M4 are turned on/off (switching) and thereby, a relatively high current of several amperes flows through the transistors M3 and M4 and the low-pass filter. Therefore, two problems are pointed out, first, the transistors M3 and M4 and the inductor L2 which configures the low-pass filter are likely to produce heat (first problem), second, noise due to a spike current is produced and causes malfunction (second problem).

Regarding the first problem, a heat sink or a blast fan is disposed and thus, heat of the heated elements needs to be released. In the present embodiment, since elements which are likely to produce heat, specifically, transistors M3-*a*, M4-*a*, M3-*b*, and M4-*b*, or the inductors L2-*a* and L2-*b* are aggregated on the back surface, action may be taken against the heat production on the back surface. It is possible to simplify the configuration for releasing heat compared to a configuration in which the heat-producing elements are scattered on both surfaces.

Regarding the second problem, the present inventors confirm, by performing a simulation, that noise is superimposed on a signal which is returned through the pins Vfb and Ifb due to an impedance component which parasitizes to, particularly, the capacitor C10 of the inductor L2 and the capacitor C10 which configure the low-pass filter, in FIG. 10, and thus, the problem results in malfunction.

Regarding the second problem, in the present embodiment, elements of the capacitor C10-*a* (C10-*b*) and the feedback circuit Fbc-a (Fbc-b) of the elements that configure the low-pass filter are all mounted on the same back surface and the back surface is prepared by patterning a ground as follows.

Figure 14:
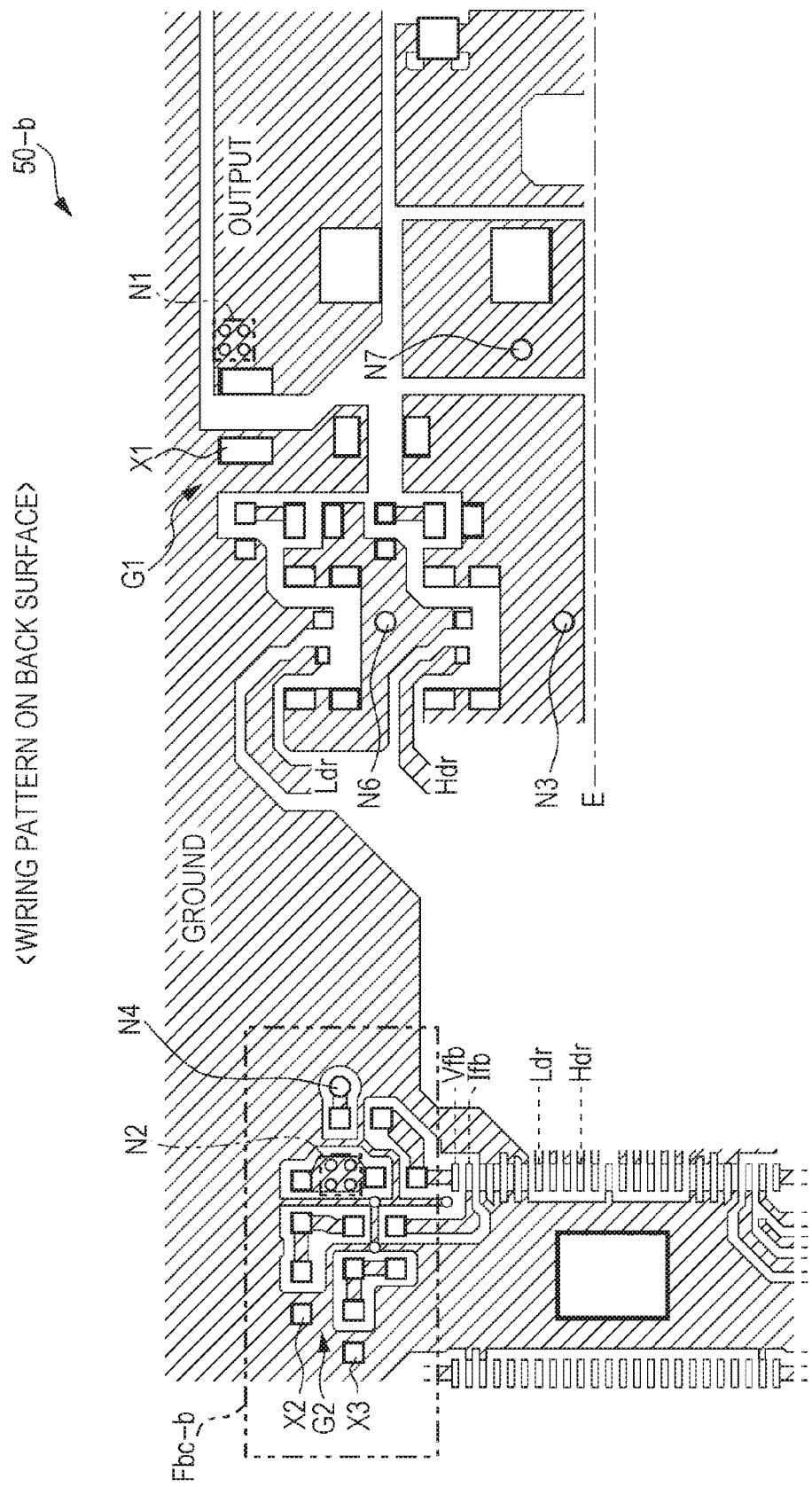
FIG. 14 is a plan view illustrating a wiring pattern on the back surface of the circuit board.

FIG. 14 is a view illustrating the wiring pattern on the back surface in the circuit board and, particularly, the drive circuit 50-*b* is picked out to be shown. In addition, FIG. 15 is a plan view illustrating a relationship between the arrangement of the elements of the drive circuit 50-*b* and the wiring pattern illustrated in FIG. 14 in the circuit board.

Figure 15:
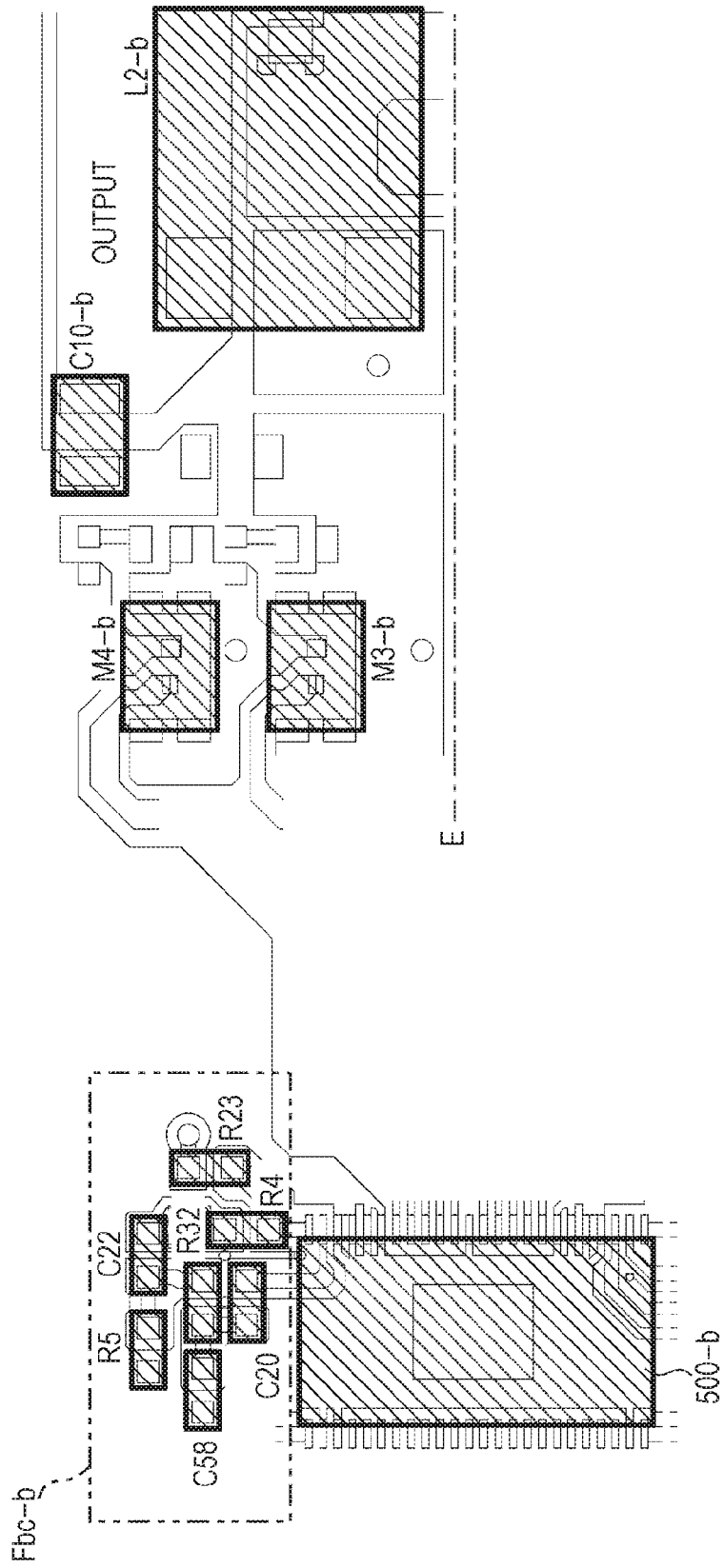
FIG. 15 is a view illustrating a relationship between the pattern and the elements on the back surface of the circuit board.

As illustrated in FIGS. 14 and 15, the other end X1 of the capacitor C10-*b* is connected to a ground pattern G1 as a first ground wiring. In addition, ground ends X2 and X3 in elements of the feedback circuit Fbc-b are connected to a ground pattern G2 as a second ground wiring. The ground patterns G1 and G2 are electrically common ground patterns formed on the back surface as illustrated in FIG. 14.

As illustrated in FIG. 10, the ground end X2 is the other end of the resistor R5 and the ground end X3 is the other end of the capacitor C58. In addition, the source electrode of the transistor M4-*b* is also configured to be connected to the common ground pattern.

Incidentally, in a case where the elements of the drive circuit 50 are mounted on both surfaces of the circuit board, a certain element can be mounted on the front surface and another element can be mounted on the back surface. However, for example, in a configuration in which the capacitor C10 is mounted on one surface and the feedback circuit Fbc is mounted on the other surface, both grounds are connected through a through-hole. Therefore, a case where driving is performed at a relatively high frequency as in the present embodiment is equivalent to a state in which a relatively great inductance component parasitizes on the other end of the capacitor C10 and the above malfunction is brought about.

In contrast, in the present embodiment, the elements of the capacitor C10-6 and the feedback circuit Fbc-b are all mounted on the same back surface and a single common ground pattern is provided from the other end X1 of the capacitor to the ground ends X2 and X3 of the feedback circuit. Therefore, it is possible to suppress an influence of the parasitic inductance component to be smaller compared to the configuration in which the other end of the capacitor and the connection end of the feedback circuit are connected through the through-hole.

In FIG. 14, a through-hole N1 is provided on a pattern which includes a terminal Out (output) which is a connection point of the other end of the inductor L2-*b* and one end of the capacitor C10-*b*. In addition, a through-hole N2 is provided on a pattern which includes a connection point of one end of the capacitor C22 in the feedback circuit Fbc-b and one end of the resistor R4. Here, in the circuit diagram in FIG. 10, two systems are formed from the terminal Out and returning is performed through the pins Vfb and Ifb of the LSI 500. Practically, as illustrated in FIG. 14 and FIG. 15, the systems are configured to be guided to an insertion wiring pattern (not illustrated) from the through-hole N1 of the terminal Out on the back surface, to be again guided to the back surface through the through-hole N2 in front of the LSI 500, and to diverge to one end of the resistor R4 and to one end of the capacitor C22. The path on the resistor R4 side is returned to the pin Vfb and the path on the capacitor C22 side is returned to the pin Ifb.

Here, when a wiring pattern on the front surface is referred to as a first layer and a wiring pattern on the back surface is referred to as g-th (g is an integer of 3 or more) layer, the insertion wiring pattern means a wiring pattern which is configured of a wiring layer that is inserted into the front surface and the back surface, that is, a second layer, a third layer, . . . , and a (g−1)-th layer.

In addition, a through-hole N3 is provided in a pattern to which the drain electrode of the transistor M3-*b* is connected. A through-hole N4 is provided in a pattern which is connected to the other end of the resistor R23 in the feedback circuit Fbc-b. To the through-holes N3 and N4, the insertion patterns (not illustrated) are connected and the voltage Vh is applied.

A through-hole N6 is provided in the pattern that includes a connection point of the source electrode of the transistor M3-*b* with the drain electrode of the transistor M4-*b*. A through-hole N7 is provided in the pattern that is connected to one end of the inductor L2-*b*. The circuit is guided from the through-hole N6 to the insertion wiring pattern (not illustrated) and is again guided to the back surface through the through-hole N7. Accordingly, the connection point Sd is electrically connected to one end of the inductor L2-*b*.

Here, the wiring pattern or the like of the drive circuit 50-*b* is described and the wiring pattern in the drive circuit 50-*a*, particularly, a periphery of the transistors M3-*a* and M4-*a*, the inductor L2-*a*, and the capacitor C10-*a*, is substantially symmetrical to the wiring pattern of the drive circuit 50-*b* with a straight line E in FIG. 14 and FIG. 15 as a reference. However, the feedback circuit Fbc-a is shifted to the rightward side in FIGS. 14 and 15, that is, to the side on which the transistors M3-*a* and M4-*a* are positioned. The drive circuit 50-*a* is not particularly illustrated; however, a single common ground pattern is provided from the other end of the capacitor C10-*a* to the connection end of the feedback circuit Fbc-a.

The invention is not limited to the embodiments described above and various modifications and, for example, applications as will be described below can be performed. The aspects of the modifications and applications which will be described below can be used by one or combination of a plurality of aspects which are carefully selected.

In the embodiment, the LSI 500-*b* is mounted on the same back surface as the transistors M3-*b* and M4-*b*, the inductor L2-*b*, the capacitor C10-*b*, and the feedback circuit Fbc-b; however, the LSI 500-*b* may be mounted on the front surface. In addition, since the transistors M3-*b* and M4-*b* and the inductor L2-*b* are collectively mounted on the same surface in a point of view of heat release as described above, the transistors M3-*a* and M4-*a* and the inductor L2-*a* may be mounted together not on the back surface but on the front surface.

In the embodiment, the drive circuit 50 is configured to return the drive signal COM-A (COM-B) which is subjected to smoothing of the amplified modulated signal by the low-pass filter in the generation of the modulated signal Ms; however, the modulated signal Ms itself may be returned. For example, no particular illustration is provided; however, a configuration may be employed, in which an error between the modulated signal Ms and the input signal As is calculated, the signal which delays the error and the signal Aa which is the target are added to each other or subtracted from each other, and a result is input to the comparator 520.

The amplified modulated signal existing at the connection point Sd of the transistors M3 and M4 is different from the modulated signal Ms only in the logic amplitude. Therefore a configuration may be employed, in which, for example, after attenuating the amplified modulated signal, the amplified modulated signal is returned in the same way as the modulated signal Ms.

In addition, in the embodiment illustrated in FIG. 2, for convenience of description, the number of nozzles is set to be relatively small and two drive circuits 50-*a* and 50-*b* are configured to output the drive signals COM-A and COM-B, respectively; however, the drive circuits may be provided to further output the drive signals COM-C, COM-D, or the like. That is, the number of the drive circuits is not limited to "2".

According to the printing apparatus 1, the head unit including the plurality of nozzles 651 may not be configured to discharge the ink while reciprocating in the main scanning direction, but may be a so-called line printer in which a plurality of head units having nozzles that are arranged in a direction orthogonal to or oblique to the sub scanning direction are provided and the head units are fixed to a housing.

According to the embodiment, an example of the piezoelectric element 60 that discharges ink is described as a drive target of the drive circuit 50. However, the drive target is not limited to the piezoelectric element 60, but, for example, may be any capacitive load such as an ultrasonic motor, a touch panel, a flat speaker, or a display such as a liquid crystal. That is, the drive circuit 50 may be a capacitive load drive circuit that drives such capacitive loads.

What is claimed is:

1. A drive circuit for driving a capacitive load, comprising:
   a modulation circuit that generates a modulated signal by pulse-modulating a source signal;
   a transistor that amplifies the modulated signal to generate an amplified modulated signal;
   a low-pass filter that includes an inductor and a capacitor and smoothes the amplified modulated signal to generate a drive signal which is applied to the capacitive load;
   a feedback circuit that returns the drive signal to the modulation circuit; and
   a circuit board on which the modulation circuit, the transistor, the low-pass filter, and the feedback circuit are mounted,
   wherein the circuit board has a first mounting surface and a second mounting surface,
   wherein the capacitor and the feedback circuit are mounted and a first ground wiring connected to the capacitor and a second ground wiring connected to the feedback circuit are provided on the first mounting surface, and
   wherein at least one of the modulation circuit, the transistor, and the inductor is mounted on the second mounting surface.

2. The drive circuit for driving a capacitive load according to claim 1,
   wherein a frequency of the modulated signal is from 1 MHz to 8 MHz.

3. The drive circuit for driving a capacitive load according to claim 1,
   wherein the first ground wiring and the second ground wiring are formed as a single pattern.

4. The drive circuit for driving a capacitive load according to claim 1,
   wherein the transistor and the inductor are mounted on the same mounting surface.

5. The drive circuit for driving a capacitive load according to claim 1,
   wherein a plurality of drive circuits that include the modulation circuit, the transistor, the low-pass filter, and the feedback circuit are mounted on the circuit board, and
   wherein a plurality of the capacitors and a plurality of the feedback circuits are mounted and a plurality of the first ground wirings and a plurality of the second ground wirings are provided on the first mounting surface.

* * * * *